US011330208B2

(12) United States Patent
Douady-Pleven et al.

(10) Patent No.: US 11,330,208 B2
(45) Date of Patent: *May 10, 2022

(54) IMAGE SIGNAL PROCESSING FOR REDUCING LENS FLARE

(71) Applicant: GoPro, Inc., San Mateo, CA (US)

(72) Inventors: Bruno César Douady-Pleven, Orsay (FR); Nicolas Boehrer, Paris (FR); Thomas Nicolas Emmanuel Veit, Meudon (FR)

(73) Assignee: GoPro, Inc., San Mateo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/849,498

(22) Filed: Apr. 15, 2020

(65) Prior Publication Data

US 2020/0244901 A1 Jul. 30, 2020

Related U.S. Application Data

(63) Continuation of application No. 15/984,837, filed on May 21, 2018, now Pat. No. 10,630,921.

(51) Int. Cl.
*H04N 5/357* (2011.01)
*H01L 27/146* (2006.01)
(Continued)

(52) U.S. Cl.
CPC ..... *H04N 5/3572* (2013.01); *H01L 27/14623* (2013.01)

(58) Field of Classification Search
CPC ............ H04N 5/3572; H01L 27/14623; G06T 2207/10012; G06T 2207/20221; G06T 5/50; G06T 5/006
See application file for complete search history.

(56) References Cited

U.S. PATENT DOCUMENTS 10,630,921 B2 * 4/2020 Douady-Pleven ...... G06T 5/006
2009/0002529 A1 * 1/2009 Shurboff ............ H04N 5/23232
348/251

(Continued)

FOREIGN PATENT DOCUMENTS

WO 2014042104 A1 3/2014

OTHER PUBLICATIONS

International Search Report and Written Opinion for Application No. PCT/US2019/020241, dated Jun. 3, 2019, 12 pages.

*Primary Examiner* — Albert H Cutler
(74) *Attorney, Agent, or Firm* — Young Basile Hanlon & MacFarlane, P.C.

(57) ABSTRACT

Flare compensation includes obtaining a first input frame, which includes lens flare, and a second input frame; obtaining a stitch line between the first input frame and the second input frame; obtaining, for the first input frame, a first intensity profile; obtaining, for the second input frame, a second intensity profile; obtaining an intensity differences profile; obtaining a first dark corner profile based on a first illumination of a first area outside a first image circle of the first input frame; obtaining a second dark corner profile based on a second illumination of a second area outside a second image circle of the second input frame; obtaining a dark corner difference profile; calculating a flare model; obtaining a flare mask; and correcting the first input frame by subtracting the flare mask from the first input frame.

20 Claims, 13 Drawing Sheets

(51) Int. Cl.
    *G06T 5/50*    (2006.01)
    *G06T 5/00*    (2006.01)

(56) References Cited

U.S. PATENT DOCUMENTS

| | | | |
|---|---|---|---|
| 2009/0060369 A1* | 3/2009 | Agarwala | G06T 5/50 |
| | | | 382/261 |
| 2011/0242352 A1 | 10/2011 | Hikosaka | |
| 2012/0147213 A1* | 6/2012 | Dalton | H04N 9/646 |
| | | | 348/223.1 |
| 2013/0329132 A1 | 12/2013 | Tico | |
| 2014/0320715 A1* | 10/2014 | Haji-Khamneh | |
| | | | H04N 5/23229 |
| | | | 348/302 |
| 2015/0103181 A1* | 4/2015 | Mou | H04N 5/3651 |
| | | | 348/162 |
| 2015/0146014 A1 | 5/2015 | Black | |
| 2015/0365576 A1* | 12/2015 | Wang | H04N 5/238 |
| | | | 348/251 |
| 2017/0070689 A1 | 3/2017 | Silverstein | |
| 2017/0094169 A1 | 3/2017 | Yoshikawa | |
| 2017/0243373 A1* | 8/2017 | Bevensee | H04N 7/22 |
| 2017/0359534 A1 | 12/2017 | Li | |

* cited by examiner

IMAGE SIGNAL PROCESSING FOR REDUCING LENS FLARE

CROSS-REFERENCE TO RELATED APPLICATION(S)

This application is a continuation of U.S. patent application Ser. No. 15/984,837, filed May 21, 2018, the entire disclosure of which is hereby incorporated by reference.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

TECHNICAL FIELD

The present disclosure relates to digital image and video processing, including temporal and spatial image noise reduction, local motion compensation, spatially combining images, image distortion compensation, bitrate allocation, image alignment, prevention of highlight clipping, and reduction in lens flare.

BACKGROUND

Image capture devices, such as cameras, may capture content as images or video. Light may be received and focused via a lens and may be converted to an electronic image signal by an image sensor. The image signal may be processed by an image signal processor to form an image, which may be stored and/or encoded. In some implementations, multiple images or video frames may include spatially adjacent or overlapping content. Accordingly, systems, methods, and apparatus for capturing, processing, and/or encoding images, video, or both may be advantageous.

SUMMARY

The present disclosure satisfies the foregoing needs by providing, inter alia, apparatus and methods for image signal processing for reducing lens flare. For simplicity, the descriptions disclosed herein refer to flare being generated by a primary light source. Implementations disclosed herein, however, may also compensate for flare discrepancies resulting from multiple light sources.

A first aspect is a method for flare compensation. The method includes obtaining a first input frame that includes lens flare and a second input frame, each includes color channels; obtaining a stitch line between the first input frame and the second input frame; obtaining, for the first input frame, a first intensity profile; obtaining, for the second input frame, a second intensity profile; obtaining an intensity differences profile as a difference between the first intensity profile and the second intensity profile; obtaining, for the first input frame, a first dark corner profile based on a first illumination of a first area outside a first image circle of the first input frame; obtaining, for the second input frame, a second dark corner profile based on a second illumination of a second area outside a second image circle of the second input frame; obtaining a dark corner difference profile as a difference between the first dark corner profile and the second dark corner profile; calculating a flare model using the intensity differences profile and the dark corner difference profile; obtaining a flare mask based on the flare model and on a flare difference estimation along the stitch line between the first input frame and the second input frame; and correcting the first input frame by subtracting the flare mask from the first input frame.

Another aspect is a non-transitory computer-readable storage medium that includes executable instructions that, when executed by a processor, facilitate performance of operations including obtaining a first input frame that includes lens flare and a second input frame, where the first input frame and the second input frame are in an RGB color space; calculating a stitch line between the first input frame and the second input frame; obtaining a dark corner profile based on a relative illumination of an area outside a first image circle of the first input frame and outside a second image circle of the second input frame; obtaining a flare mask based on a flare difference estimation along the stitch line between the first input frame and the second input frame; and obtaining a processed frame by modifying the first input frame based on a flare model to minimize the lens flare.

Another aspect is an apparatus that includes a first image capture device, a second image capture device, and an image processor. The image processor is configured to obtain a first input frame captured by the first image capture device and includes lens flare, the first image capture device having a first field-of-view; obtain a second input frame captured by the second image capture device, the second image capture device having a second field-of-view partially overlapping the first field-of-view; obtain a dark corner profile based on a relative illumination of an area outside a first image circle of the first input frame and outside a second image circle of the second input frame; obtain a flare mask based on a flare difference estimation along a stitch line between the first input frame and the second input frame; and obtain a processed frame by modifying the first input frame based on a flare model to minimize the lens flare.

These and other objects, features, and characteristics of the apparatus, system, and/or method disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the disclosure. As used in the specification and in the claims, the singular forms of "a," "an," and "the" include plural referents unless the context clearly dictates otherwise.

BRIEF DESCRIPTION OF THE DRAWINGS

The disclosed embodiments have other advantages and features which will be more readily apparent from the detailed description, the appended claims, and the accompanying figures. A brief introduction of the figures is below.

Figure 1:
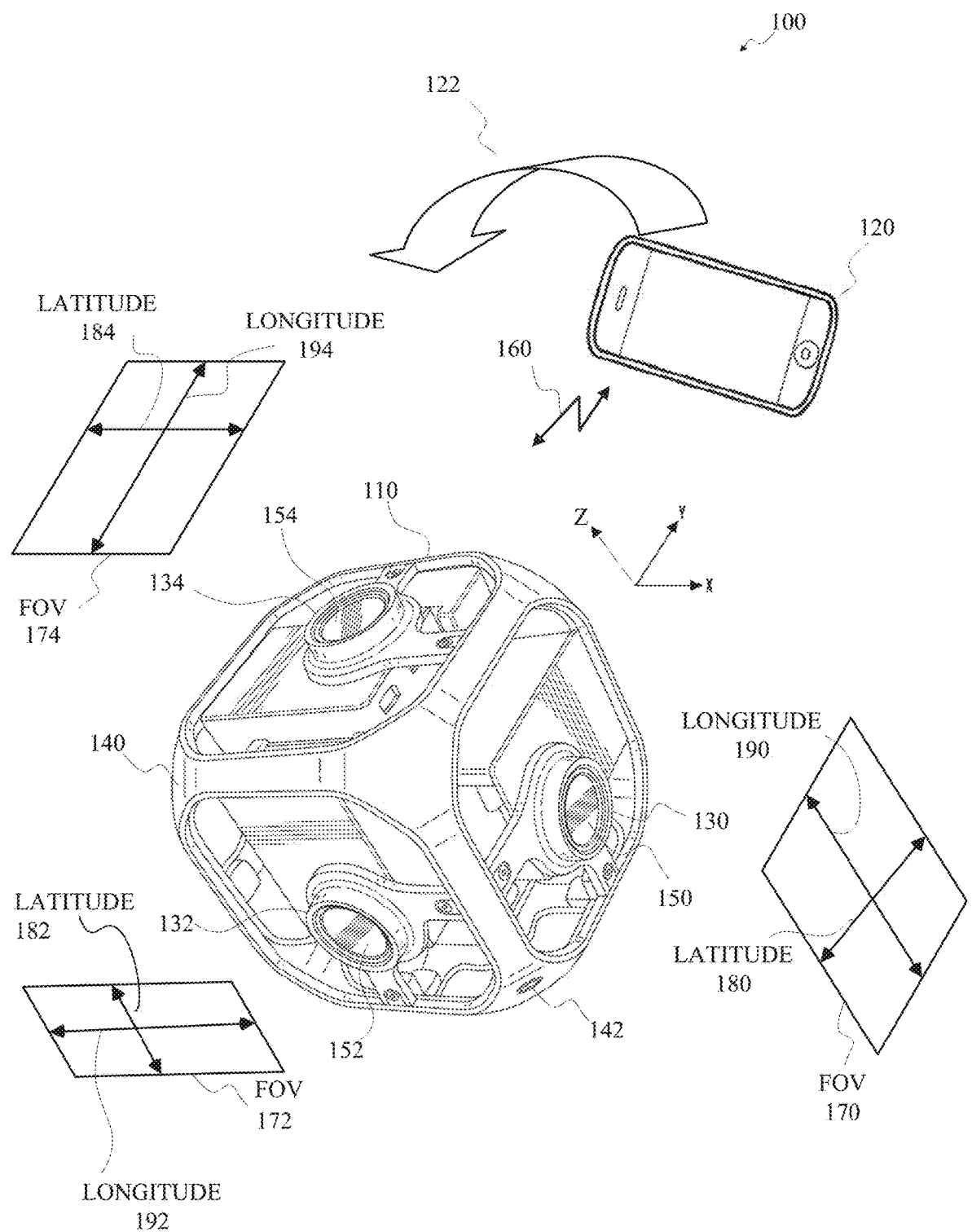
FIG. 1 is a diagram of an example of an image capture system for content capture in accordance with implementations of this disclosure.

All figures disclosed herein are © Copyright 2020 GoPro Inc. All rights reserved.

DETAILED DESCRIPTION

Implementations of the present technology will now be described in detail with reference to the drawings, which are provided as examples so as to enable those skilled in the art to practice the technology. The figures and examples are not meant to limit the scope of the present disclosure to a single implementation or embodiment, and other implementations and embodiments are possible by way of interchange of, or combination with, some or all of the described or illustrated elements. Wherever convenient, the same reference numbers will be used throughout the drawings to refer to same or like parts.

Content, such as visual content, may be captured as one or more images or video frames by one or more image capture devices, such as a camera or camera array. An image capture device may include one or more lenses, image sensors, image signal processors, encoders, or combinations thereof. A lens may receive and focus light on an image sensor or sensors along a focused image path. An image sensor or sensors may sample the light and generate an electronic image signal. An image signal processor (ISP) may receive the image signal from one or more sensors and may process the image signal to generate an image, picture, or frame.

The image sensor may receive light along one or more paths other than the focused image path, such as light from a primary light source, such as the sun, reflected by an interior surface of the image capture device, and images captured by the image sensor may include lens flare corresponding to the light from the primary light source received along paths other than the focused image path. The lens flare may include lens flare artifacts, diffuse lens flare, or both in the respective image and may limit the accuracy, efficiency, or both of aligning an image that includes lens flare with a corresponding partially overlapping image that omits the lens flare to obtain a combined image.

Processing the image signal may include image signal processing for reducing lens flare. Image signal processing for reducing lens flare may include obtaining primary light source information, which may include information indicating an orientation of the image capture device relative to the primary light source, information indicating a brightness of the primary light source, or both. For example, the primary light source information may be obtained by projecting differences between overlapping portions of the image including the lens flare and the corresponding partially overlapping image that omits the lens flare onto a flare model. The primary light source information may be applied in conjunction with the flare model to the input image including the lens flare to obtain a flare reduced input image, which may reduce or eliminate the lens flare and improve the accuracy, efficiency, or both, of aligning the image that includes lens flare with the corresponding partially overlapping image that omits the lens flare to obtain the combined image.

FIG. 1 is a diagram of an example of an image capture system 100 for content capture in accordance with implementations of this disclosure. As shown in FIG. 1, an image capture system 100 may include an image capture apparatus 110, an external user interface (UI) device 120, or a combination thereof.

In some implementations, the image capture apparatus 110 may be a multi-face apparatus and may include multiple image capture devices, such as image capture devices 130, 132, 134, as shown in FIG. 1, arranged in a structure 140, such as a cube-shaped cage as shown. Although three image capture devices 130, 132, 134 are shown for simplicity in FIG. 1, the image capture apparatus 110 may include any number of image capture devices. For example, the image capture apparatus 110 shown in FIG. 1 may include six cameras, which may include the three image capture devices 130, 132, 134 shown and three cameras not shown.

In some implementations, the structure 140 may have dimensions, such as between 25 mm and 150 mm. For example, the length of each side of the structure 140 may be 105 mm. The structure 140 may include a mounting port 142, which may be removably attachable to a supporting structure, such as a tripod, a photo stick, or any other camera mount (not shown). The structure 140 may be a rigid support structure, such that the relative orientation of the image capture devices 130, 132, 134 of the image capture apparatus 110 may be maintained in relatively static or fixed alignment, except as described herein.

The image capture apparatus 110 may obtain, or capture, image content, such as images, video, or both, with a 360° field-of-view, which may be referred to herein as panoramic or spherical content. For example, each of the image capture devices 130, 132, 134 may include respective lenses for receiving and focusing light, and respective image sensors for converting the received and focused light to an image signal, such as by measuring or sampling the light, and the multiple image capture devices 130, 132, 134 may be arranged such that the respective image sensors and lenses capture a combined field-of-view characterized by a spherical or near spherical field-of-view.

In some implementations, each of the image capture devices 130, 132, 134 may have a respective field-of-view 170, 172, 174, such as a field-of-view 170, 172, 174 that includes 90° in a lateral, or latitudinal, dimension 180, 182, 184 and includes 120° in a longitudinal dimension 190, 192,

194. In some implementations, the image capture devices 130, 132, 134 having overlapping fields-of-view 170, 172, 174, or the image sensors thereof, may be oriented at defined angles, such as at 90°, with respect to one another. In some implementations, the image sensor of the image capture device 130 is directed along the X axis, the image sensor of the image capture device 132 is directed along the Y axis, and the image sensor of the image capture device 134 is directed along the Z axis. The respective fields-of-view 170, 172, 174 for the adjacent image capture devices 130, 132, 134 may be oriented to allow overlap for a stitching function. For example, the longitudinal dimension 190 of the field-of-view 170 for the image capture device 130 may be oriented at 90° with respect to the lateral dimension 184 of the field-of-view 174 for the image capture device 134; the lateral dimension 180 of the field-of-view 170 for the image capture device 130 may be oriented at 90° with respect to the longitudinal dimension 192 of the field-of-view 172 for the image capture device 132; and the lateral dimension 182 of the field-of-view 172 for the image capture device 132 may be oriented at 90° with respect to the longitudinal dimension 194 of the field-of-view 174 for the image capture device 134.

The image capture apparatus 110 shown in FIG. 1 may have 420° angular coverage in vertical and/or horizontal planes by the successive overlap of 90°, 120°, 90°, 120° respective fields-of-view 170, 172, 174 (not all shown) for four adjacent image capture devices 130, 132, 134 (not all shown). For example, fields-of-view 170, 172 for the image capture devices 130, 132 and fields-of-view (not shown) for two image capture devices (not shown) opposite the image capture devices 130, 132, respectively, may be combined to provide 420° angular coverage in a horizontal plane. In some implementations, the overlap between fields-of-view of image capture devices 130, 132, 134 having a combined field-of-view including less than 360° angular coverage in a vertical and/or horizontal plane may be aligned and merged or combined to produce a panoramic image. For example, the image capture apparatus 110 may be in motion, such as rotating, and source images captured by at least one of the image capture devices 130, 132, 134 may be combined to form a panoramic image. As another example, the image capture apparatus 110 may be stationary, and source images captured contemporaneously by each image capture device 130, 132, 134 may be combined to form a panoramic image.

In some implementations, an image capture device 130, 132, 134 may include a lens 150, 152, 154 or another optical element. An optical element may include one or more lens, macro lens, zoom lens, special-purpose lens, telephoto lens, prime lens, achromatic lens, apochromatic lens, process lens, wide-angle lens, ultra-wide-angle lens, fisheye lens, infrared lens, ultraviolet lens, perspective control lens, other lens, and/or other optical element. In some implementations, a lens 150, 152, 154 may be a fisheye lens and produce fisheye, or near-fisheye, field-of-view images. For example, the respective lenses 150, 152, 154 of the image capture devices 130, 132, 134 may be fisheye lenses. In some implementations, images captured by two or more image capture devices 130, 132, 134 of the image capture apparatus 110 may be combined by stitching or merging fisheye projections of the captured images to produce an equirectangular planar image. For example, a first fisheye image may be a round or elliptical image, and may be transformed to a first rectangular image; a second fisheye image may be a round or elliptical image, and may be transformed to a second rectangular image; and the first and second rectangular images may be arranged side-by-side, which may include overlapping, and stitched together to form the equirectangular planar image.

Although not expressly shown in FIG. 1, in some implementations, an image capture device 130, 132, 134 may include one or more image sensors, such as a charge-coupled device (CCD) sensor, an active pixel sensor (APS), a complementary metal-oxide-semiconductor (CMOS) sensor, an N-type metal-oxide-semiconductor (NMOS) sensor, and/or any other image sensor or combination of image sensors.

Although not expressly shown in FIG. 1, in some implementations, an image capture apparatus 110 may include one or more microphones, which may receive, capture, and record audio information, which may be associated with images acquired by the image sensors.

Although not expressly shown in FIG. 1, the image capture apparatus 110 may include one or more other information sources or sensors, such as an inertial measurement unit (IMU), a global positioning system (GPS) receiver component, a pressure sensor, a temperature sensor, a heart rate sensor, or any other unit, or combination of units, that may be included in an image capture apparatus.

In some implementations, the image capture apparatus 110 may interface with or communicate with an external device, such as the external user interface (UI) device 120, via a wired (not shown) or wireless (as shown) computing communication link 160. Although a single computing communication link 160 is shown in FIG. 1 for simplicity, any number of computing communication links may be used. Although the computing communication link 160 shown in FIG. 1 is shown as a direct computing communication link, an indirect computing communication link, such as a link including another device or a network, such as the Internet, may be used. In some implementations, the computing communication link 160 may be a Wi-Fi link, an infrared link, a Bluetooth (BT) link, a cellular link, a ZigBee link, a near-field communications (NFC) link, such as an ISO/IEC 23243 protocol link, an Advanced Network Technology interoperability (ANT+) link, and/or any other wireless communications link or combination of links. In some implementations, the computing communication link 160 may be a High-Definition Multimedia Interface (HDMI) link, a Universal Serial Bus (USB) link, a digital video interface link, a display port interface link, such as a Video Electronics Standards Association (VESA) digital display interface link, an Ethernet link, a Thunderbolt link, and/or other wired computing communication link.

In some implementations, the user interface device 120 may be a computing device, such as a smartphone, a tablet computer, a phablet, a smart watch, a portable computer, and/or another device or combination of devices configured to receive user input, communicate information with the image capture apparatus 110 via the computing communication link 160, or receive user input and communicate information with the image capture apparatus 110 via the computing communication link 160.

In some implementations, the image capture apparatus 110 may transmit images, such as panoramic images, or portions thereof, to the user interface device 120 via the computing communication link 160, and the user interface device 120 may store, process, display, or a combination thereof the panoramic images.

In some implementations, the user interface device 120 may display, or otherwise present, content, such as images or video, acquired by the image capture apparatus 110. For example, a display of the user interface device 120 may be a viewport into the three-dimensional space represented by the panoramic images or video captured or created by the image capture apparatus 110.

In some implementations, the user interface device 120 may communicate information, such as metadata, to the image capture apparatus 110. For example, the user interface device 120 may send orientation information of the user interface device 120 with respect to a defined coordinate system to the image capture apparatus 110, such that the image capture apparatus 110 may determine an orientation of the user interface device 120 relative to the image capture apparatus 110. Based on the determined orientation, the image capture apparatus 110 may identify a portion of the panoramic images or video captured by the image capture apparatus 110 for the image capture apparatus 110 to send to the user interface device 120 for presentation as the viewport. In some implementations, based on the determined orientation, the image capture apparatus 110 may determine the location of the user interface device 120 and/or the dimensions for viewing of a portion of the panoramic images or video.

In an example, a user may rotate, or sweep, the user interface device 120 through an arc or path 122 in space, as indicated by the arrow shown at 122 in FIG. 1. The user interface device 120 may communicate display orientation information to the image capture apparatus 110 using a communication interface, such as the computing communication link 160. The image capture apparatus 110 may provide an encoded bitstream to enable viewing of a portion of the panoramic content corresponding to a portion of the environment of the display location as the image capture apparatus 110 traverses the path 122. Accordingly, display orientation information from the user interface device 120 may be transmitted to the image capture apparatus 110 to control user selectable viewing of captured images and/or video.

In some implementations, the image capture apparatus 110 may communicate with one or more other external devices (not shown) via wired or wireless computing communication links (not shown).

In some implementations, data, such as image data, audio data, and/or other data, obtained by the image capture apparatus 110 may be incorporated into a combined multimedia stream. For example, the multimedia stream may include a video track and/or an audio track. As another example, information from various metadata sensors and/or sources within and/or coupled to the image capture apparatus 110 may be processed to produce a metadata track associated with the video and/or audio track. The metadata track may include metadata, such as white balance metadata, image sensor gain metadata, sensor temperature metadata, exposure time metadata, lens aperture metadata, bracketing configuration metadata, and/or other parameters. In some implementations, a multiplexed stream may be generated to incorporate a video and/or audio track and one or more metadata tracks.

In some implementations, the user interface device 120 may implement or execute one or more applications to manage or control the image capture apparatus 110. For example, the user interface device 120 may include an application for controlling camera configuration, video acquisition, video display, or any other configurable or controllable aspect of the image capture apparatus 110.

In some implementations, the user interface device 120 may, such as via an application, generate and share, such as via a cloud-based or social media service, one or more images or short video clips, such as in response to user input.

In some implementations, the user interface device 120 may, such as via an application, remotely control the image capture apparatus 110, such as in response to user input.

In some implementations, the user interface device 120 may, such as via an application, display unprocessed or minimally processed images or video captured by the image capture apparatus 110 contemporaneously with capturing the images or video by the image capture apparatus 110, such as for shot framing, which may be referred to herein as a live preview, and which may be performed in response to user input.

In some implementations, the user interface device 120 may, such as via an application, mark one or more key moments contemporaneously with capturing the images or video by the image capture apparatus 110, such as with a HiLight Tag, such as in response to user input.

In some implementations, the user interface device 120 may, such as via an application, display or otherwise present marks or tags associated with images or video, such as HiLight Tags, such as in response to user input. For example, marks may be presented in a GoPro Camera Roll application for location review and/or playback of video highlights.

In some implementations, the user interface device 120 may, such as via an application, wirelessly control camera software, hardware, or both. For example, the user interface device 120 may include a web-based graphical interface accessible by a user for selecting a live or previously recorded video stream from the image capture apparatus 110 for display on the user interface device 120.

In some implementations, the user interface device 120 may receive information indicating a user setting, such as an image resolution setting, such as 3840 pixels by 2160 pixels; a frame rate setting, such as 60 frames per second (fps); a location setting; and/or a context setting, which may indicate an activity, such as mountain biking, in response to user input; and may communicate the settings or related information to the image capture apparatus 110.

Figure 2:
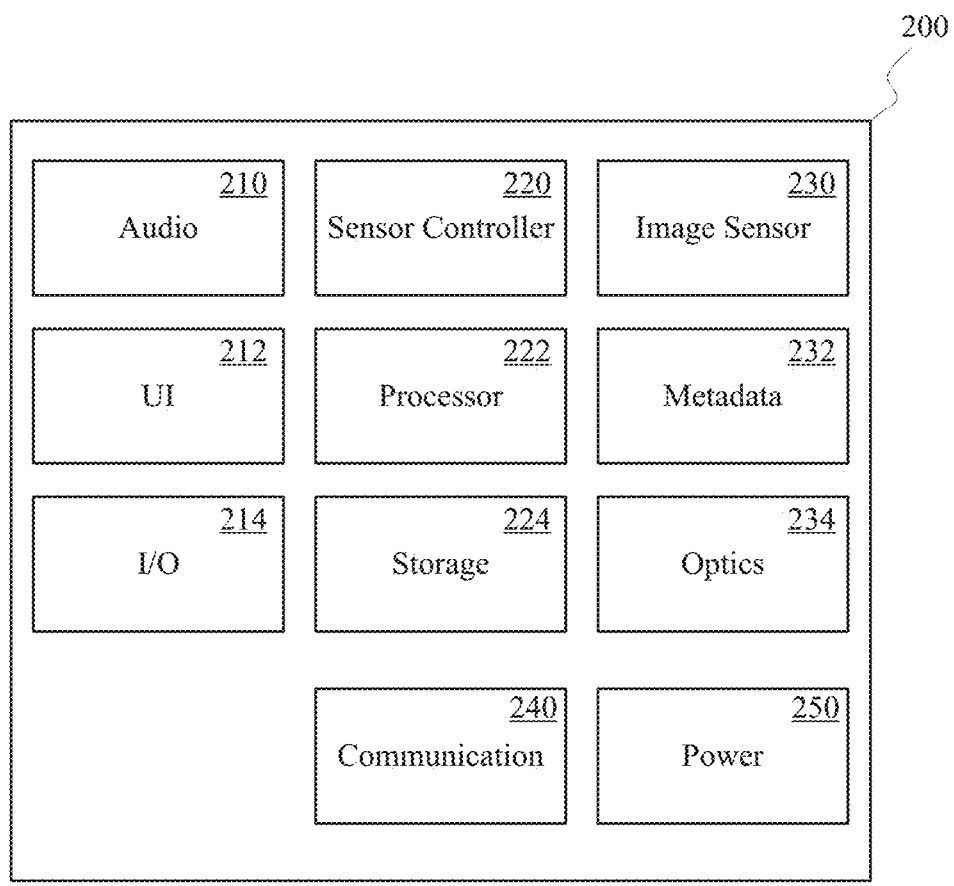
FIG. 2 is a block diagram of an example of an image capture device in accordance with implementations of this disclosure.

FIG. 2 is a block diagram of an example of an image capture device 200 in accordance with implementations of this disclosure. In some implementations, an image capture device 200, such as one of the image capture devices 130, 132, 134 shown in FIG. 1, which may be an action camera, may include an audio component 210, a user interface (UI) unit 212, an input/output (I/O) unit 214, a sensor controller 220, a processor 222, an electronic storage unit 224, an image sensor 230, a metadata unit 232, an optics unit 234, a communication unit 240, a power system 250, or a combination thereof.

In some implementations, the audio component 210, which may include a microphone, may receive, sample, capture, record, or a combination thereof audio information, such as sound waves, which may be associated with, such as stored in association with, image or video content contemporaneously captured by the image capture device 200. In some implementations, audio information may be encoded using, for example, Advanced Audio Coding (AAC), Audio Compression 3 (AC3), Moving Picture Experts Group Layer-3 Audio (MP3), linear Pulse Code Modulation (PCM), Moving Picture Experts Group-High efficiency coding and media delivery in heterogeneous environments (MPEG-H), and/or other audio coding formats (audio codecs). In one or more implementations of spherical video and/or audio, the audio codec may include a three-dimensional audio codec, such as Ambisonics. For example, an Ambisonics codec can produce full surround audio including a height dimension. Using a G-format Ambisonics codec, a special decoder may be omitted.

In some implementations, the user interface unit 212 may include one or more units that may register or receive input from and/or present outputs to a user, such as a display, a touch interface, a proximity-sensitive interface, a light receiving/emitting unit, a sound receiving/emitting unit, a wired/wireless unit, and/or other units. In some implementations, the user interface unit 212 may include a display, one or more tactile elements, such as buttons and/or virtual touchscreen buttons, lights (LEDs), speakers, and/or other user interface elements. The user interface unit 212 may receive user input and/or provide information to a user related to the operation of the image capture device 200.

In some implementations, the user interface unit 212 may include a display unit that presents information related to camera control or use, such as operation mode information, which may include image resolution information, frame rate information, capture mode information, sensor mode information, video mode information, photo mode information, or a combination thereof; connection status information, such as connected, wireless, wired, or a combination thereof; power mode information, such as standby mode information, sensor mode information, video mode information, or a combination thereof; information related to other information sources, such as heart rate information, global positioning system information, or a combination thereof; and/or other information.

In some implementations, the user interface unit 212 may include a user interface component such as one or more buttons, which may be operated, such as by a user, to control camera operations, such as to start, stop, pause, and/or resume sensor and/or content capture. The camera control associated with respective user interface operations may be defined. For example, the camera control associated with respective user interface operations may be defined based on the duration of a button press (pulse width modulation), a number of button presses (pulse code modulation), or a combination thereof. In an example, a sensor acquisition mode may be initiated in response to detecting two short button presses. In another example, the initiation of a video mode and cessation of a photo mode, or the initiation of a photo mode and cessation of a video mode, may be triggered (toggled) in response to a single short button press. In another example, video or photo capture for a given time duration or a number of frames (burst capture) may be triggered in response to a single short button press. Other user command or communication implementations may also be implemented, such as one or more short or long button presses.

In some implementations, the I/O unit 214 may synchronize the image capture device 200 with other cameras and/or with other external devices, such as a remote control, a second image capture device, a smartphone, a user interface device, such as the user interface device 120 shown in FIG. 1, and/or a video server. The I/O unit 214 may communicate information between I/O components. In some implementations, the I/O unit 214 may be connected to the communication unit 240 to provide a wired and/or wireless communications interface, such as a Wi-Fi interface, a Bluetooth interface, a USB interface, an HDMI interface, a wireless USB interface, a Near-Field Communication (NFC) interface, an Ethernet interface, a radio frequency transceiver interface, and/or other interfaces, for communication with one or more external devices, such as a user interface device, such as the user interface device 120 shown in FIG. 1, or another metadata source. In some implementations, the I/O unit 214 may interface with LED lights, a display, a button, a microphone, speakers, and/or other I/O components. In some implementations, the I/O unit 214 may interface with an energy source, for example, a battery, and/or a Direct Current (DC) electrical source.

In some implementations, the I/O unit 214 of the image capture device 200 may include one or more connections to external computerized devices for configuration and/or management of remote devices, as described herein. The I/O unit 214 may include any of the wireless or wireline interfaces described herein, and/or may include customized or proprietary connections for specific applications.

In some implementations, the sensor controller 220 may operate or control the image sensor 230, such as in response to input, such as user input. In some implementations, the sensor controller 220 may receive image and/or video input from the image sensor 230 and may receive audio information from the audio component 210.

In some implementations, the processor 222 may include a system on a chip (SOC), microcontroller, microprocessor, CPU, DSP, application-specific integrated circuit (ASIC), GPU, and/or other processor that may control the operation and functionality of the image capture device 200. In some implementations, the processor 222 may interface with the sensor controller 220 to obtain and process sensory information for, for example, object detection, face tracking, stereo vision, and/or other image processing.

In some implementations, the sensor controller 220, the processor 222, or both may synchronize information received by the image capture device 200. For example, timing information may be associated with received sensor data, and metadata information may be related to content, such as images or videos, captured by the image sensor 230 based on the timing information. In some implementations, the metadata capture may be decoupled from video/image capture. For example, metadata may be stored before, after, and in-between the capture, processing, or storage of one or more video clips and/or images.

In some implementations, the sensor controller 220, the processor 222, or both may evaluate or process received metadata and may generate other metadata information. For example, the sensor controller 220 may integrate the received acceleration information to determine a velocity profile for the image capture device 200 concurrent with recording a video. In some implementations, video information may include multiple frames of pixels and may be encoded using an encoding method, such as H.264, H.265, CineForm, and/or other codecs.

Although not shown separately in FIG. 2, one or more of the audio component 210, the user interface unit 212, the I/O unit 214, the sensor controller 220, the processor 222, the electronic storage unit 224, the image sensor 230, the metadata unit 232, the optics unit 234, the communication unit 240, or the power systems 250 of the image capture device 200 may communicate information, power, or both with one or more other units, such as via an electronic communication pathway, such as a system bus. For example, the processor 222 may interface with the audio component 210, the user interface unit 212, the I/O unit 214, the sensor controller 220, the electronic storage unit 224, the image sensor 230, the metadata unit 232, the optics unit 234, the communication unit 240, or the power systems 250 via one or more driver interfaces and/or software abstraction layers. In some implementations, one or more of the units shown in FIG. 2 may include a dedicated processing unit, memory unit, or both (not shown). In some implementations, one or more components may be operable by one or more other control processes. For example, a global positioning system receiver may include a processing apparatus that may provide position and/or motion information to the processor 222 in accordance with a defined schedule, such as values of latitude, longitude, and elevation at 10 Hz.

In some implementations, the electronic storage unit 224 may include a system memory module that may store executable computer instructions that, when executed by the processor 222, perform various functionalities, including those described herein. For example, the electronic storage unit 224 may be a non-transitory computer-readable storage medium, which may include executable instructions, and a processor, such as the processor 222, may execute the instructions to perform one or more, or portions of one or more, of the operations described herein. The electronic storage unit 224 may include storage memory for storing content (e.g., metadata, images, audio) captured by the image capture device 200.

In some implementations, the electronic storage unit 224 may include non-transitory memory for storing configuration information and/or processing code for video information and metadata capture, and/or to produce a multimedia stream that may include video information and metadata in accordance with the present disclosure. In some implementations, the configuration information may include capture type, such as video or still image, image resolution, frame rate, burst setting, white balance, recording configuration, such as loop mode, audio track configuration, and/or other parameters that may be associated with audio, video, and/or metadata capture. In some implementations, the electronic storage unit 224 may include memory that may be used by other hardware/firmware/software elements of the image capture device 200.

In some implementations, the image sensor 230 may include one or more of a charge-coupled device sensor, an active pixel sensor, a complementary metal-oxide-semiconductor sensor, an N-type metal-oxide-semiconductor sensor, and/or another image sensor or combination of image sensors. In some implementations, the image sensor 230 may be controlled based on control signals from a sensor controller 220.

The image sensor 230 may sense or sample light waves gathered by the optics unit 234 and may produce image data or signals. The image sensor 230 may generate an output signal conveying visual information regarding the objects or other content corresponding to the light waves received by the optics unit 234. The visual information may include one or more of an image, a video, and/or other visual information.

In some implementations, the image sensor 230 may include a video sensor, an acoustic sensor, a capacitive sensor, a radio sensor, a vibrational sensor, an ultrasonic sensor, an infrared sensor, a radar sensor, a Light Detection and Ranging (LIDAR) sensor, a sonar sensor, or any other sensory unit or combination of sensory units capable of detecting or determining information in a computing environment.

In some implementations, the metadata unit 232 may include sensors, such as an inertial measurement unit, which may include one or more accelerometers and/or gyroscopes, a magnetometer, a compass, a global positioning system sensor, an altimeter, an ambient light sensor, a temperature sensor, and/or other sensors or combinations of sensors. In some implementations, the image capture device 200 may contain one or more other metadata/telemetry sources, for example, image sensor parameters, battery monitor, storage parameters, and/or other information related to camera operation and/or capture of content. The metadata unit 232 may obtain information related to the environment of the image capture device 200 and aspects in which the content is captured.

For example, the metadata unit 232 may include an accelerometer that may provide device motion information including velocity and/or acceleration vectors representative of motion of the image capture device 200. In another example, the metadata unit 232 may include a gyroscope that may provide orientation information describing the orientation of the image capture device 200. In another example, the metadata unit 232 may include a global positioning system sensor that may provide global positioning system coordinates, time, and information identifying a location of the image capture device 200. In another example, the metadata unit 232 may include an altimeter that may obtain information indicating an altitude of the image capture device 200.

In some implementations, the metadata unit 232, or one or more portions thereof, may be rigidly coupled to the image capture device 200, such that motion, changes in orientation, or changes in the location of the image capture device 200 may be accurately detected by the metadata unit 232. Although shown as a single unit, the metadata unit 232, or one or more portions thereof, may be implemented as multiple distinct units. For example, the metadata unit 232 may include a temperature sensor as a first physical unit and a global positioning system unit as a second physical unit. In some implementations, the metadata unit 232, or one or more portions thereof, may be included in an image capture device 200 as shown, or may be included in a physically separate unit operatively coupled to, such as in communication with, the image capture device 200.

In some implementations, the optics unit 234 may include one or more of a lens, macro lens, zoom lens, special-purpose lens, telephoto lens, prime lens, achromatic lens, apochromatic lens, process lens, wide-angle lens, ultra-wide-angle lens, fisheye lens, infrared lens, ultraviolet lens, perspective control lens, other lens, and/or other optics component. In some implementations, the optics unit 234 may include a focus controller unit that may control the operation and configuration of the camera lens. The optics unit 234 may receive light from an object and may focus the received light onto an image sensor 230. Although not shown separately in FIG. 2, in some implementations, the optics unit 234 and the image sensor 230 may be combined, such as in a combined physical unit, such as a housing.

In some implementations, the communication unit 240 may be coupled to the I/O unit 214 and may include a component, such as a dongle, having an infrared sensor, a radio frequency transceiver and antenna, an ultrasonic transducer, and/or other communications interfaces used to send and receive wireless communication signals. In some implementations, the communication unit 240 may include a local, such as Bluetooth or Wi-Fi, and/or broad range, such as cellular LTE, communications interface for communication between the image capture device 200 and a remote device, such as the user interface device 120 in FIG. 1. The communication unit 240 may communicate using, for example, Ethernet, 802.11, worldwide interoperability for microwave access (WiMAX), 3G, Long Term Evolution (LTE), digital subscriber line (DSL), asynchronous transfer mode (ATM), InfiniBand, PCI Express Advanced Switching, and/or other communication technologies. In some implementations, the communication unit 240 may communicate using networking protocols, such as multiprotocol label switching (MPLS), transmission control protocol/Internet protocol (TCP/IP), User Datagram Protocol (UDP), hypertext transport protocol (HTTP), simple mail transfer protocol (SMTP), file transfer protocol (FTP), and/or other networking protocols.

Information exchanged via the communication unit 240 may be represented using formats including one or more of hypertext markup language (HTML), extensible markup language (XML), and/or other formats. One or more exchanges of information between the image capture device 200 and remote or external devices may be encrypted using encryption technologies, including one or more of secure sockets layer (SSL), transport layer security (TLS), virtual private networks (VPNs), Internet Protocol security (IPsec), and/or other encryption technologies.

In some implementations, the one or more power systems 250 supply power to the image capture device 200. For example, for a small-sized, lower-power action camera, a wireless power solution, such as a battery, a solar cell, an inductive (contactless) power source, rectification, and/or other power supply, may be used.

Consistent with the present disclosure, the components of the image capture device 200 may be remote from one another and/or aggregated. For example, one or more sensor components may be distal from the image capture device 200, for example, such as shown and described with respect to FIG. 1. Multiple mechanical, sensory, or electrical units may be controlled by a learning apparatus via network/radio connectivity.

Figure 3:
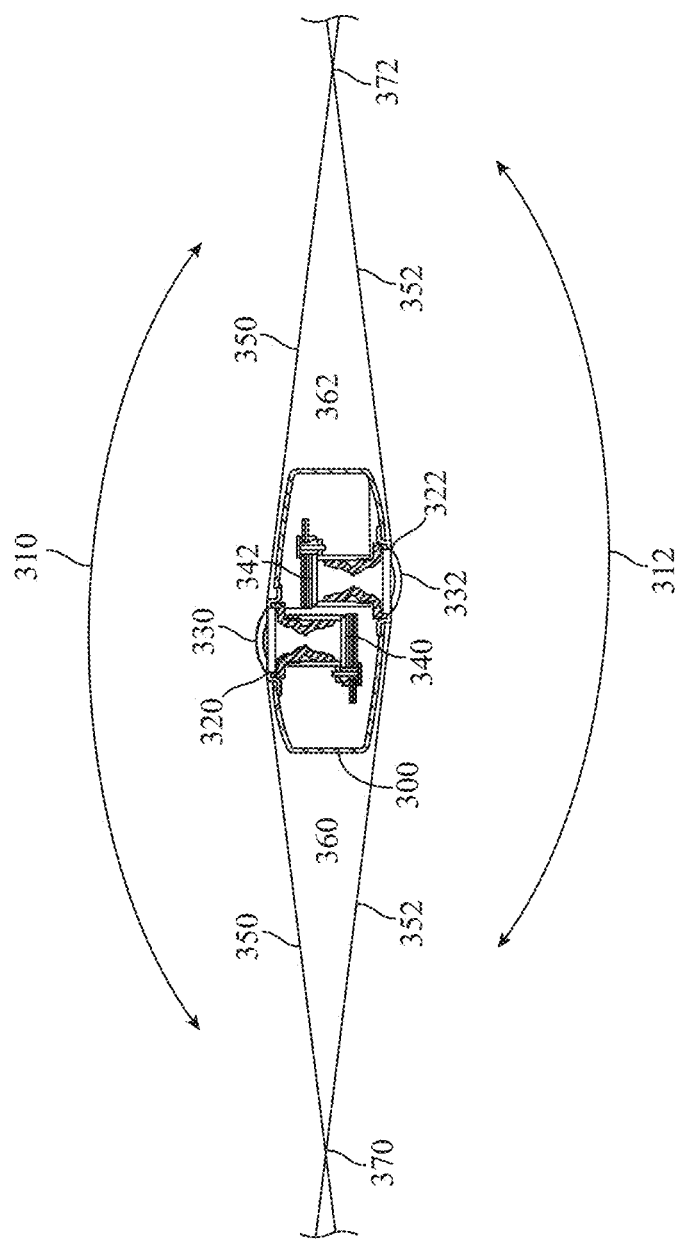
FIG. 3 is a cross-sectional view of an example of a dual-lens image capture apparatus including overlapping fields-of-view in accordance with implementations of this disclosure.

FIG. 3 is a cross-sectional view of an example of a dual-lens image capture apparatus 300 including overlapping fields-of-view 310, 312 in accordance with implementations of this disclosure. In some implementations, the image capture apparatus 300 may be a spherical image capture apparatus with fields-of-view 310, 312 as shown in FIG. 3. For example, the image capture apparatus 300 may include image capture devices 320, 322, related components, or a combination thereof, arranged in a back-to-back or Janus configuration. For example, a first image capture device 320 may include a first lens 330 and a first image sensor 340, and a second image capture device 322 may include a second lens 332 and a second image sensor 342 arranged oppositely from the first lens 330 and the first image sensor 340.

The first lens 330 of the image capture apparatus 300 may have the field-of-view 310 shown above a boundary 350. Behind the first lens 330, the first image sensor 340 may capture a first hyper-hemispherical image plane from light entering the first lens 330, corresponding to the first field-of-view 310.

The second lens 332 of the image capture apparatus 300 may have a field-of-view 312, as shown below a boundary 352. Behind the second lens 332, the second image sensor 342 may capture a second hyper-hemispherical image plane from light entering the second lens 332, corresponding to the second field-of-view 312.

In some implementations, one or more areas, such as blind spots 360, 362, may be outside of the fields-of-view 310, 312 of the lenses 330, 332; light may be obscured from the lenses 330, 332 and the corresponding image sensors 340, 342; and content in the blind spots 360, 362 may be omitted from capture. In some implementations, the image capture apparatus 300 may be configured to minimize the blind spots 360, 362.

In some implementations, the fields-of-view 310, 312 may overlap. Stitch points 370, 372, proximal to the image capture apparatus 300, at which the fields-of-view 310, 312 overlap may be referred to herein as overlap points or stitch points. Content captured by the respective lenses 330, 332, distal to the stitch points 370, 372, may overlap.

In some implementations, images contemporaneously captured by the respective image sensors 340, 342 may be combined to form a combined image. Combining the respective images may include correlating the overlapping regions captured by the respective image sensors 340, 342, aligning the captured fields-of-view 310, 312, and stitching the images together to form a cohesive combined image.

In some implementations, a small change in the alignment, such as position and/or tilt, of the lenses 330, 332, the image sensors 340, 342, or both may change the relative positions of their respective fields-of-view 310, 312 and the locations of the stitch points 370, 372. A change in alignment may affect the size of the blind spots 360, 362, which may include changing the size of the blind spots 360, 362 unequally.

In some implementations, incomplete or inaccurate information indicating the alignment of the image capture devices 320, 322, such as the locations of the stitch points 370, 372, may decrease the accuracy, efficiency, or both of generating a combined image. In some implementations, the image capture apparatus 300 may maintain information indicating the location and orientation of the lenses 330, 332 and the image sensors 340, 342, such that the fields-of-view 310, 312, stitch points 370, 372, or both may be accurately determined, which may improve the accuracy, efficiency, or both of generating a combined image.

In some implementations, optical axes through the lenses 330, 332 may be substantially antiparallel to each other, such that the respective axes may be within a tolerance such as 1%, 3%, 5%, 10%, and/or other tolerances. In some implementations, the image sensors 340, 342 may be substantially perpendicular to the optical axes through their respective lenses 330, 332, such that the image sensors may be perpendicular to the respective axes to within a tolerance such as 1%, 3%, 5%, 10%, and/or other tolerances.

In some implementations, the lenses 330, 332 may be laterally offset from each other, may be off-center from a central axis of the image capture apparatus 300, or may be laterally offset and off-center from the central axis. As compared to an image capture apparatus with back-to-back lenses, such as lenses aligned along the same axis, the image capture apparatus 300 including laterally offset lenses 330, 332 may include substantially reduced thickness relative to the lengths of the lens barrels securing the lenses 330, 332. For example, the overall thickness of the image capture apparatus 300 may be close to the length of a single lens barrel, as opposed to twice the length of a single lens barrel, as in a back-to-back configuration. Reducing the lateral distance between the lenses 330, 332 may improve the overlap in the fields-of-view 310, 312.

In some implementations, images or frames captured by an image capture apparatus, such as the image capture apparatus 110 shown in FIG. 1 or the image capture apparatus 300 shown in FIG. 3, may be combined, merged, or stitched together to produce a combined image, such as a spherical or panoramic image, which may be an equirectangular planar image. In some implementations, generating a combined image may include three-dimensional, or spatiotemporal, noise reduction (3DNR). In some implementations, pixels along the stitch boundary may be matched accurately to minimize boundary discontinuities.

Figure 4:
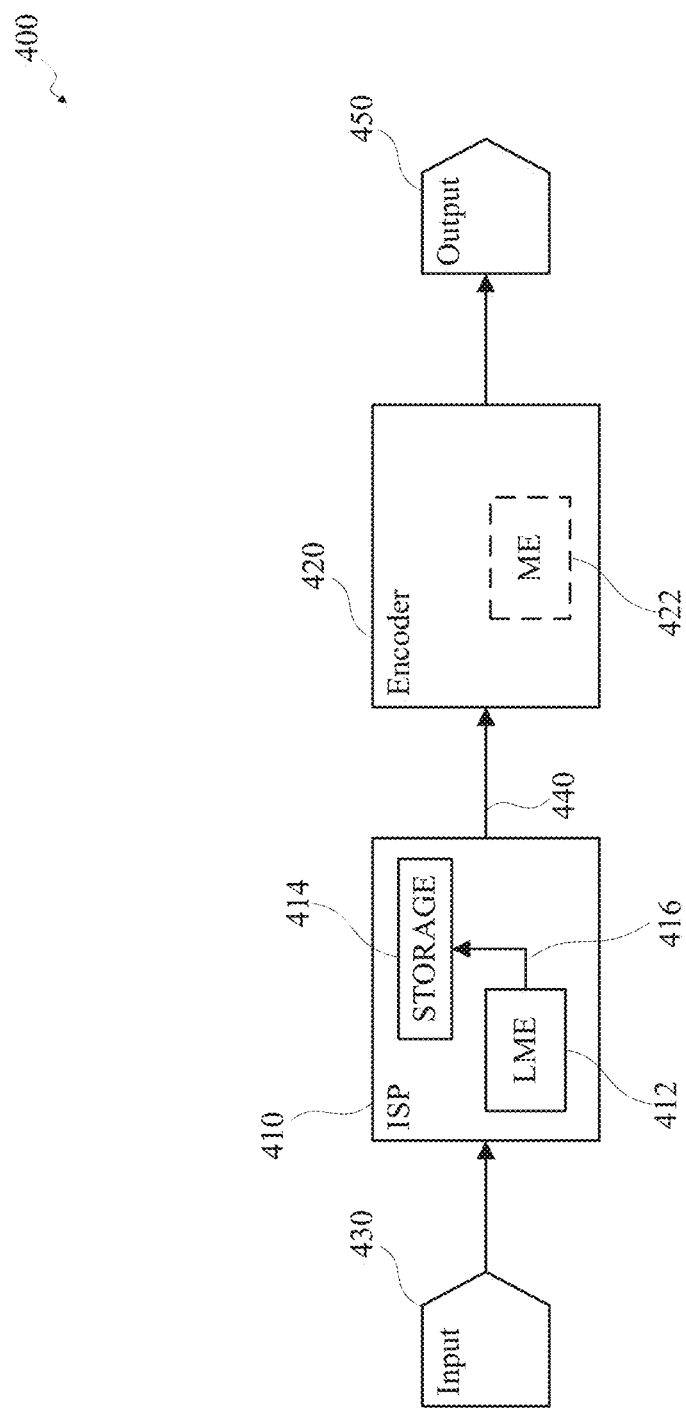
FIG. 4 is a block diagram of an example of an image processing and coding pipeline in accordance with implementations of this disclosure.

FIG. 4 is a block diagram of an example of an image processing and coding pipeline 400 in accordance with implementations of this disclosure. In some implementations, the image processing and coding pipeline 400 may be included in an image capture device, such as the image capture device 200 shown in FIG. 2, or an image capture apparatus, such as the image capture apparatus 110 shown in FIG. 1 or the image capture apparatus 300 shown in FIG. 3. In some implementations, the image processing and coding pipeline 400 may include an image signal processor (ISP) 410, an encoder 420, or a combination thereof.

In some implementations, the image signal processor 410 may receive an input image signal 430. For example, an image sensor (not shown), such as the image sensor 230 shown in FIG. 2, may capture an image, or a portion thereof, and may send, or transmit, the captured image, or image portion, to the image signal processor 410 as the input image signal 430. In some implementations, an image, or frame, such as an image, or frame, included in the input image signal, may be one of a sequence or series of images or frames of a video, such as a sequence or series of frames captured at a rate, or frame rate, which may be a number or cardinality of frames captured per a defined temporal period, such as 24, 30, or 60 frames per second.

In some implementations, the image signal processor 410 may include a local motion estimation (LME) unit 412, which may generate local motion estimation information for use in image signal processing and encoding, such as in correcting distortion, stitching, and/or motion compensation. In some implementations, the local motion estimation unit 412 may partition the input image signal 430 into blocks, such as having 4×4, 16×16, 64×64, and/or other dimensions. In some implementations, the local motion estimation unit 412 may partition the input image signal 430 into arbitrarily shaped patches and/or individual pixels.

In some implementations, the local motion estimation unit 412 may compare pixel values of blocks of pixels between image frames, such as successive image frames, from the input image signal 430 to determine displacement, or movement, between frames. The local motion estimation unit 412 may produce motion vectors, such as an x component and y component of motion, at multiple locations within an image frame. The motion vectors may be represented by a translational model or other models that may approximate camera motion, such as rotation and translation in three dimensions, and zooming.

In some implementations, the image signal processor 410 of the image processing and coding pipeline 400 may include electronic storage 414, such as memory, such as random-access memory (RAM), flash, or other types of memory. The electronic storage 414 may store local motion estimation information 416 determined by the local motion estimation unit 412 for one or more frames. The local motion estimation information 416 and associated image or images may be output 440 to the encoder 420. In some implementations, the electronic storage 414 may include a buffer, or cache, and may buffer the input image signal as an input, or source, image, or frame.

In some implementations, the image signal processor 410 may output an image, associated local motion estimation information 416, or both as the output 440. For example, the image signal processor 410 may receive the input image signal 430, process the input image signal 430, and output a processed image as the output 440. Processing the input image signal 430 may include generating and using the local motion estimation information 416, spatiotemporal noise reduction (3DNR), dynamic range enhancement, local tone adjustment, exposure adjustment, contrast adjustment, image stitching, and/or other operations.

The encoder 420 may encode or compress the output 440 of the image signal processor 410. In some implementations, the encoder 420 may implement the one or more encoding standards, which may include motion estimation.

In some implementations, the encoder 420 may output encoded video as an encoded output 450. For example, the encoder 420 may receive the output 440 of the image signal processor 410, which may include processed images, the local motion estimation information 416, or both. The encoder 420 may encode the images and may output the encoded images as the encoded output 450.

In some implementations, the encoder 420 may include a motion estimation unit 422 that may determine motion information for encoding the image output 440 of the image signal processor 410. In some implementations, the encoder 420 may encode the image output 440 of the image signal processor 410 using motion information generated by the motion estimation unit 422 of the encoder 420, the local motion estimation information 416 generated by the local motion estimation unit 412 of the image signal processor 410, or a combination thereof.

For example, the motion estimation unit 422 may determine motion information at pixel block sizes that may differ from pixel block sizes used by the local motion estimation unit 412. In another example, the motion estimation unit 422 of the encoder 420 may generate motion information, and the encoder may encode the image output 440 of the image signal processor 410 using the motion information generated by the motion estimation unit 422 of the encoder 420 and the local motion estimation information 416 generated by the local motion estimation unit 412 of the image signal processor 410. In another example, the motion estimation unit 422 of the encoder 420 may use the local motion estimation information 416 generated by the local motion estimation unit 412 of the image signal processor 410 as input for efficiently and accurately generating motion information.

In some implementations, the image signal processor 410, the encoder 420, or both may be distinct units, as shown. For example, the image signal processor 410 may include a motion estimation unit, such as the local motion estimation unit 412 as shown, and/or the encoder 420 may include a motion estimation unit, such as the motion estimation unit 422.

In some implementations, the image signal processor 410 may store motion information, such as the local motion estimation information 416, in a memory, such as the electronic storage 414, and the encoder 420 may read the motion information from the electronic storage 414 or otherwise receive the motion information from the image signal processor 410. The encoder 420 may use the motion estimation information determined by the image signal processor 410 for motion compensation processing.

Figure 5:
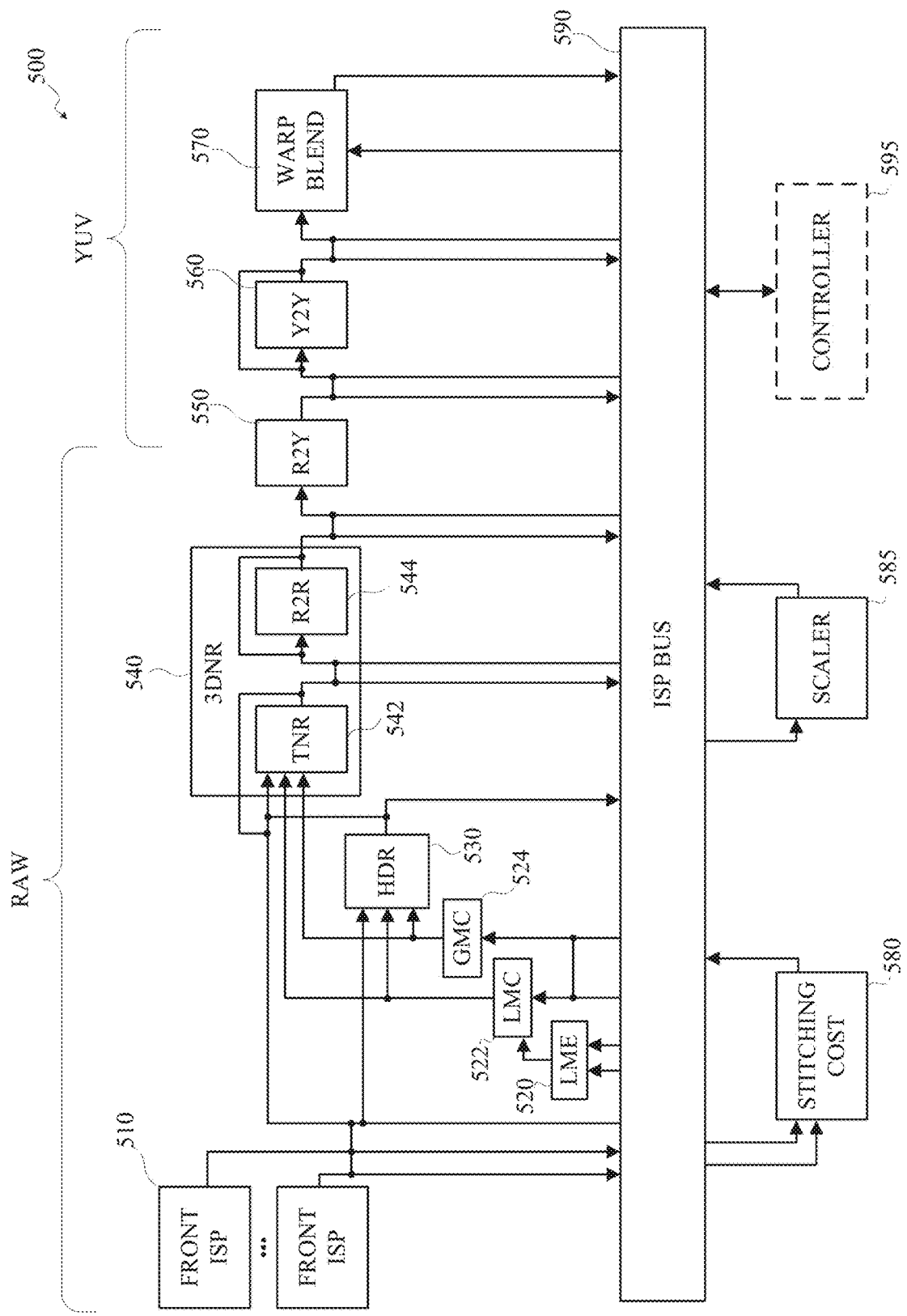
FIG. 5 is a functional block diagram of an example of an image signal processor in accordance with implementations of this disclosure.

FIG. 5 is a functional block diagram of an example of an image signal processor 500 in accordance with implementations of this disclosure. An image signal processor 500 may be included in an image capture device, such as the image capture device 200 shown in FIG. 2, or in an image capture apparatus, such as the image capture apparatus 110 shown in FIG. 1 or the image capture apparatus 300 shown in FIG. 3. In some implementations, the image signal processor 500 may be similar to the image signal processor 410 shown in FIG. 4.

The image signal processor 500 may receive an image signal, such as from an image sensor (not shown), such as the image sensor 230 shown in FIG. 2, in a defined format, such as a format of the image sensor, which may be referred to herein as "raw," such as "a raw image," "raw image data," "raw data," "a raw signal," or "a raw image signal." For example, the raw image signal may be in a format such as RGB format, which may represent individual pixels using a combination of values or components, such as a red component (R), a green component (G), and a blue component (B). In another example, the raw image signal may be in a Bayer format, wherein each pixel may be one of a combination of adjacent pixels, such as a combination of four adjacent pixels, of a Bayer pattern. For clarity, a sequence of pixels forming a Bayer pattern may be referred to herein as a Bayer. In some implementations, the image signal processor 500 may convert the raw image data (RGB data) to another format, such as a format expressing individual pixels using a combination of values or components, such as a luminance, or luma, value (Y), a blue chrominance, or chroma, value (U or Cb), and a red chroma value (V or Cr), such as the YUV or YCbCr formats.

The image signal processor 500 may include a front image signal processor (Front ISP) 510, or multiple front image signal processors as shown, a local motion estimation (LME) unit 520, a local motion compensation (LMC) unit 522, a global motion compensation (GMC) unit 524, a high dynamic range (HDR) unit 530, a three-dimensional noise reduction (3DNR) unit 540, which may include a temporal noise reduction (TNR) unit 542 and a raw to raw (R2R) unit 544, a raw to YUV (R2Y) unit 550, a YUV to YUV (Y2Y) unit 560, a warp and blend unit 570, a stitching cost unit 580, a scaler 585, an image signal processing bus (ISP BUS) 590, a configuration controller 595, or a combination thereof.

Although not shown expressly in FIG. 5, in some implementations, one or more of the front image signal processor 510, the local motion estimation unit 520, the local motion compensation unit 522, the global motion compensation unit 524, the high dynamic range unit 530, the three-dimensional noise reduction unit 540, the temporal noise reduction unit 542, the raw to raw unit 544, the raw to YUV unit 550, the YUV to YUV unit 560, the warp and blend unit 570, the stitching cost unit 580, the scaler 585, the image signal processing bus 590, the configuration controller 595, or any combination thereof, may include a respective clock, power domain, or both.

In some implementations, the front image signal processor 510 may minimally process image signals received from respective image sensors, which may include image scaling. Scaling, by the front image signal processor 510, may include processing pixels, such as a defined cardinality of pixels, corresponding to a determined quality. For example, the front image signal processor 510 may correct dead pixels, perform band processing, decouple vertical blanking, or a combination thereof. In some implementations, the front image signal processor 510 may output a high-resolution frame, one or more downscaled, or reduced, resolution frames, such as a ½×½ resolution frame, a ¼×¼ resolution frame, a ⅛×⅛ resolution frame, a ¹⁄₁₆×¹⁄₁₆ resolution frame, a ¹⁄₃₂×¹⁄₃₂ resolution frame, or any combination thereof.

In some implementations, a multiple-camera apparatus, such as the image capture apparatus 110 shown in FIG. 1, may include multiple image capture devices, such as the image capture device 200 shown in FIG. 2, and may include a respective front image signal processor 510 associated with each image capture device.

The local motion estimation unit 520 may receive, or otherwise access, an input frame, or one or more portions thereof, which may be a current input frame, such as via the image signal processor bus 590. In some implementations, the local motion estimation unit 520 may receive the current input frame at a downscaled, or reduced, resolution. In some implementations, such as implementations implementing high dynamic range image processing, the current input frame may be a long exposure input frame.

The local motion estimation unit 520 may receive, or otherwise access, a reference frame, or one or more portions thereof, such as via the image signal processor bus 590. The reference frame may be a previously generated motion compensated prior frame, which may be associated with a temporal location preceding a temporal location associated with the current input frame. For example, the reference frame may be a recirculated frame from the temporal noise reduction unit 542. In some implementations, such as implementations including high dynamic range image processing, the reference frame may be a short exposure input frame corresponding to the long exposure current input frame.

In some implementations, the local motion estimation unit 520 may receive, or otherwise access, previously generated motion information, such as previously generated motion vectors for the current input frame or motion information for a previously processed frame.

The local motion estimation unit 520 may determine motion information, such as motion vectors, representing motion between the current input frame and the reference frame, such as motion caused by moving objects in the field-of-view or non-rotational motion, or translation, of the field-of-view. The local motion estimation unit 520 may output the motion information. For example, the local motion estimation unit 520 may output motion vectors to the local motion compensation unit 522.

The local motion compensation unit 522 may receive, or otherwise access, the reference frame, or one or more portions thereof, such as via the image signal processor bus 590. For example, in some implementations, such as implementations implementing high dynamic range image processing, the reference frame may be the short exposure input frame. In another example, in some implementations implementing high dynamic range image processing, the reference frame may be the long exposure input frame.

The local motion compensation unit 522 may receive, or otherwise access, motion information, such as motion vectors, associated with the current input frame. For example, the local motion compensation unit 522 may receive the motion vectors from the local motion estimation unit 520.

The local motion compensation unit 522 may apply the motion vectors to the reference frame, or one or more portions thereof, which may align, or partially align, the reference frame, or one or more portions thereof, with the current input frame, or one or more portions thereof.

The local motion compensation unit 522 may output a local motion compensated reference frame, or one or more portions thereof.

The global motion compensation unit 524 may receive, or otherwise access, the reference frame, or one or more portions thereof, such as via the image signal processor bus 590. For example, in some implementations, such as implementations implementing high dynamic range image processing, the reference frame may be the short exposure input frame. In another example, in some implementations implementing high dynamic range image processing, the reference frame may be the long exposure input frame.

The global motion compensation unit 524 may receive, or otherwise access, global motion information, such as global motion information from a gyroscopic unit of the image capture apparatus, such as a gyroscopic sensor included in the metadata unit 232 shown in FIG. 2, corresponding to the current input frame. The global motion information may indicate a rotational change in the orientation of the field-of-view relative to the content captured in respective images.

For example, the global motion information may indicate a horizontal change of the field-of-view, which may indicate that the corresponding camera panned, or rotated, around a vertical axis. In another example, the global motion information may indicate a vertical change of the field-of-view, which may indicate that the camera tilted or rotated around an axis perpendicular to the lens. In another example, the global motion information may indicate a rotational change of the field-of-view relative to the horizon, which may indicate that the camera rolled or rotated around an axis parallel to the lens. The global motion information may be distinct from motion information, such as translation motion information, indicating a change in the geospatial location of the image capture apparatus, which may include a change associated with changing an elevation of the image capture apparatus. In some embodiments, other changes affecting the frame, such as zooming, may be included as global motion.

The global motion compensation unit 524 may apply the global motion information to the reference frame, or one or more portions thereof, which may align, or partially align, the reference frame, or one or more portions thereof, with the current input frame, or one or more portions thereof.

The global motion compensation unit 524 may output a global motion compensated reference frame, or one or more portions thereof.

The high dynamic range (HDR) unit 530 may receive, or otherwise access, the current input frame, or one or more portions thereof, such as from the front image signal processor 510. The current input frame may be a long exposure input frame corresponding to the short exposure reference frame. The high dynamic range unit 530 may receive, or otherwise access, the local motion compensated reference frame from the local motion compensation unit 522. The high dynamic range unit 530 may receive, or otherwise access, the global motion compensated reference frame from the global motion compensation unit 524.

The high dynamic range (HDR) unit 530 may generate a high dynamic range image based on the current input image and the local motion compensated reference frame, the global motion compensated reference frame, or a combination thereof. For example, for each portion of the reference frame, such as each block, each pixel, or each Bayer, the temporal noise reduction unit 542 may identify a value for the portion based on the corresponding portion of the local motion compensated reference frame or the corresponding portion of the global motion compensated reference frame.

The high dynamic range (HDR) unit 530 may output the high dynamic range image. For example, the high dynamic range (HDR) unit 530 may output the high dynamic range image by storing the high dynamic range image in memory, such as shared memory, via the image signal processor bus 590, or the high dynamic range (HDR) unit 530 may output the high dynamic range image directly to another unit of the image signal processor 500, such as the temporal noise reduction unit 542.

In some implementations, the high dynamic range (HDR) unit 530 may be omitted, or high dynamic range processing by the high dynamic range (HDR) unit 530 may be omitted.

The three-dimensional noise reduction unit 540 may include the temporal noise reduction (TNR) unit 542, the raw to raw (R2R) unit 544, or both.

The temporal noise reduction unit 542 may receive the current input frame, or one or more portions thereof, such as from the front image signal processor 510 or via the image signal processor bus 590. In some implementations, such as implementations implementing high dynamic range image processing, the temporal noise reduction unit 542 may receive the high dynamic range input frame, or one or more portions thereof, such as from the high dynamic range unit 530, as the current input frame.

The temporal noise reduction unit 542 may receive, or otherwise access, the local motion compensated reference frame from the local motion compensation unit 522. The temporal noise reduction unit 542 may receive, or otherwise access, the global motion compensated reference frame from the global motion compensation unit 524.

The temporal noise reduction unit 542 may reduce temporal noise in the current input frame, which may include recursively reducing temporal noise in a sequence of input images, such as a video. Recursive temporal noise reduction may include combining a current image with noise feedback information corresponding to a previously processed frame, such as the reference frame, which may be a recirculated frame. For example, the reference frame may be the local motion compensated frame output by the local motion compensation unit 522, the global motion compensated frame output by the global motion compensation unit 524, or a combination thereof. For example, for each portion of the reference frame, such as each block, each pixel, or each Bayer, the temporal noise reduction unit 542 may identify a value for the portion based on the corresponding portion of the local motion compensated reference frame or the corresponding portion of the global motion compensated reference frame.

The temporal noise reduction unit 542 may generate output including a pixel value and associated noise variance for the pixel value for one or more pixels of the current input frame.

The raw to raw unit 544 may perform spatial denoising of frames of raw images based on noise variance values received from the temporal noise reduction unit 542. For example, spatial denoising in the raw to raw unit 544 may include multiple passes of image signal processing, including passes at various resolutions.

The raw to YUV unit 550 may demosaic, and/or color process, the frames of raw images, which may include representing each pixel in the YUV format, which may include a combination of a luminance (Y) component and two chrominance (UV) components.

The YUV to YUV unit 560 may perform local tone mapping of YUV images. In some implementations, the YUV to YUV unit 560 may include multi-scale local tone mapping using a single pass approach or a multi-pass approach on a frame at different scales.

The warp and blend unit 570 may warp images, blend images, or both. In some implementations, the warp and blend unit 570 may warp a corona around the equator of each frame to a rectangle. For example, the warp and blend unit 570 may warp a corona around the equator of each frame to a rectangle based on the corresponding low-resolution frame generated by the front image signal processor 510.

The warp and blend unit 570 may apply one or more transformations to the frames. In some implementations, spherical images produced by a multi-face camera device, such as the image capture apparatus 110 shown in FIG. 1 or the image capture apparatus 300 shown in FIG. 3, may be warped and/or blended by the warp and blend unit 570 to correct for distortions at image edges. In some implementations, the warp and blend unit 570 may apply a transformation that is subject to a close to identity constraint, wherein a location of a pixel in an input image to the warp and blend unit 570 may be similar to, such as within a defined distance threshold of, a location of a corresponding pixel in an output image from the warp and blend unit 570. For example, the warp and blend unit 570 may include an internal memory, which may have a size, such as 100 lines, which may be smaller than a size of a frame, and the warp and blend unit 570 may process the input image data in raster-in/raster-out order using a transformation that is subject to a close to identity constraint.

In some implementations, the warp and blend unit 570 may apply a transformation that is independent of close to identity constraints, which may include processing the input image data in raster-in/dynamic-out or dynamic-in/raster-out order. For example, the warp and blend unit 570 may transform two or more non-rectilinear (fisheye) images to generate a combined frame, such as an equirectangular frame, by processing the input image data in raster-in/dynamic-out or dynamic-in/raster-out order.

The stitching cost unit 580 may generate a stitching cost map as an output. In some implementations, the cost map may be represented as a rectangle having disparity x and longitude y based on a warping. Each value of the cost map may be a cost function of a disparity x value for a corresponding longitude. Cost maps may be generated for various scales, longitudes, and disparities.

The scaler 585 may scale images received from the output of the warp and blend unit 570, which may be in patches or blocks of pixels, such as 16×16 blocks, 8×8 blocks, or patches or blocks of any other size or combination of sizes.

The image signal processing bus 590 may be a bus or interconnect, such as an on-chip interconnect or embedded microcontroller bus interface, for communication between the front image signal processor 510, the temporal noise reduction unit 542, the local motion compensation unit 522, the raw to raw unit 544, the raw to YUV unit 550, the YUV to YUV unit 560, the combined warp and blend unit 570, the stitching cost unit 580, the scaler 585, the configuration controller 595, or any combination thereof.

The configuration controller 595 may coordinate image processing by the front image signal processor 510, the local motion estimation unit 520, the local motion compensation unit 522, the global motion compensation unit 524, the high dynamic range unit 530, the three-dimensional noise reduction unit 540, the temporal noise reduction unit 542, the raw to raw unit 544, the raw to YUV unit 550, the YUV to YUV unit 560, the warp and blend unit 570, the stitching cost unit 580, the scaler 585, the image signal processing bus 590, or any combination thereof, of the image signal processor 500. For example, the configuration controller 595 may control camera alignment model calibration, auto-exposure, auto-white balance, or any other camera calibration or similar process or combination of processes. In some implementations, the configuration controller 595 may be a microcontroller. The configuration controller 595 is shown in FIG. 5 using broken lines to indicate that the configuration controller 595 may be included in the image signal processor 500 or may be external to, and in communication with, the image signal processor 500. The configuration controller 595 may include a respective clock, power domain, or both.

Figure 6:
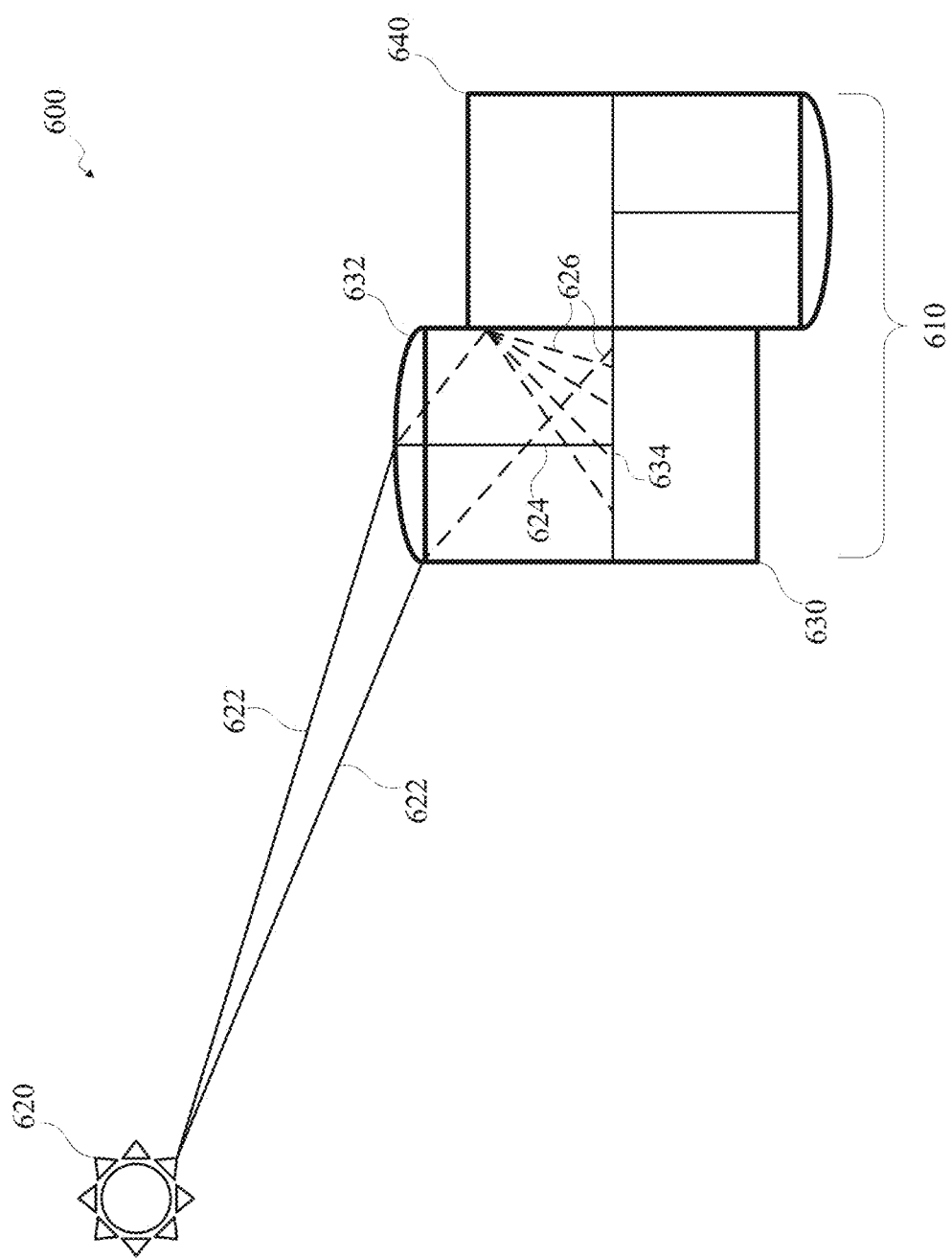
FIG. 6 is a diagram of an example of a lens flare scenario in accordance with implementations of this disclosure.

FIG. 6 is a diagram of an example of a lens flare scenario 600 in accordance with implementations of this disclosure. The lens flare scenario 600 may include an image capture apparatus 610 for capturing one or more images of a scene, which may include a primary light source 620, such that one or more of the images captured includes lens flare.

The image capture apparatus 610 may be a multi-face image capture apparatus, such as the image capture apparatus 110 shown in FIG. 1 or the image capture apparatus 300 shown in FIG. 3, and may include two or more image capture devices 630, 640, such as two or more of the image capture devices 130, 132, 134 shown in FIG. 1, the image capture device 200 shown in FIG. 2, or the image capture devices 320, 322 shown in FIG. 3, which may have overlapping fields-of-view, such as the overlapping fields-of-view 310 and 312 shown in FIG. 3. For simplicity and clarity, the image capture apparatus 610 shown in FIG. 6 includes a first image capture device 630 and a second image capture device 640; however, the image capture apparatus 610 may include more image capture devices.

For example, the first image capture device 630 may include one or more optical elements 632, such as one or more of the lenses 150, 152, 154 shown in FIG. 1, the optics unit 234 shown in FIG. 2, or the lenses 330, 332 shown in FIG. 3, and one or more image sensors 634, such as the image sensor 230 shown in FIG. 2 or the image sensors 340, 342 shown in FIG. 3.

The primary light source 620 may be the sun or another relatively bright light source, such as a high luminosity object in the scene, such as an object that is ten-thousand times brighter than other objects in the scene. The image capture apparatus 610 may be oriented with respect to, or relative to, the primary light source 620, such that the field-of-view of the first image capture device 630 includes the primary light source 620, and the field-of-view of the second image capture device 640 omits the primary light source 620.

The light 622 from the primary light source 620 may be directly received by the first image capture device 630. Other light, such as reflected light, light from a secondary light source, or a combination thereof, may be received by the first image capture device 630. The light 622 from the primary light source 620 may be prevented from being directly received by the second image capture device 640. Other light, such as reflected light, light from a secondary light source, or a combination thereof, may be received by the second image capture device 640.

In some embodiments, the primary light source 620 may be omitted from the respective fields-of-view of the image capture apparatus 610, the primary light source 620 may be relatively near the field-of-view of the first image capture device 630, some of the light 622 from the primary light source 620 may be directly received by the first image capture device 630, and the image captured by the first image capture device 630 may include lens flare. Although the lens flare is shown to result from primary light source 620, it is understood that lens flare may result from multiple light sources. The multiple light sources may be distributed on both sides of the device such that each image capture device receives a subset of light sources. In some examples, one or more light sources may be in the overlapping area.

A significant portion, such as 99.9, or 99.99, percent, of the light received, captured, measured, sampled, or otherwise used by the image sensor 634 to obtain the image may be light received via a primary image capture path 624. For example, the light received via the primary image capture path 624 may be light received by the optical elements 632 of the first image capture device 630 and focused by the optical elements 632 along the primary image capture path 624 to the image sensor 634 of the first image capture device 630.

A small portion, such as one-tenth, or one-hundredth, of one percent, of the light received, captured, measured, sampled, or otherwise used by the image sensor 634 to obtain the image may be light received via one or more secondary image capture paths 626, as indicated by the broken lines in FIG. 6. For example, the light received via the secondary image capture paths 626 may be light, which may include a portion of the light 622 directly from the primary light source 620, reflected, refracted, or otherwise propagated along the secondary image capture paths 626 to the image sensor 634, such as light reflected off of an inner surface of the image capture device 630.

Light received by the image sensor 634 along one or more of the secondary image capture paths 626 may be captured, or otherwise included in a captured image, as a lens flare artifact. As used herein, the term "lens flare artifact" may refer to one or more distinct portions of a captured image corresponding to light received along one or more of the secondary image capture paths 626. For example, the distinct portions of the captured images corresponding to a lens flare artifact may be one or more geometric shapes, such as circles, which may correspond with the shape of an iris of the lens, and which may be distributed along a line in the captured image. Lens flare artifacts may be visually distinguishable from other visible elements captured in an image. An example of an image including lens flare artifacts is shown in FIG. 7.

Figure 8:
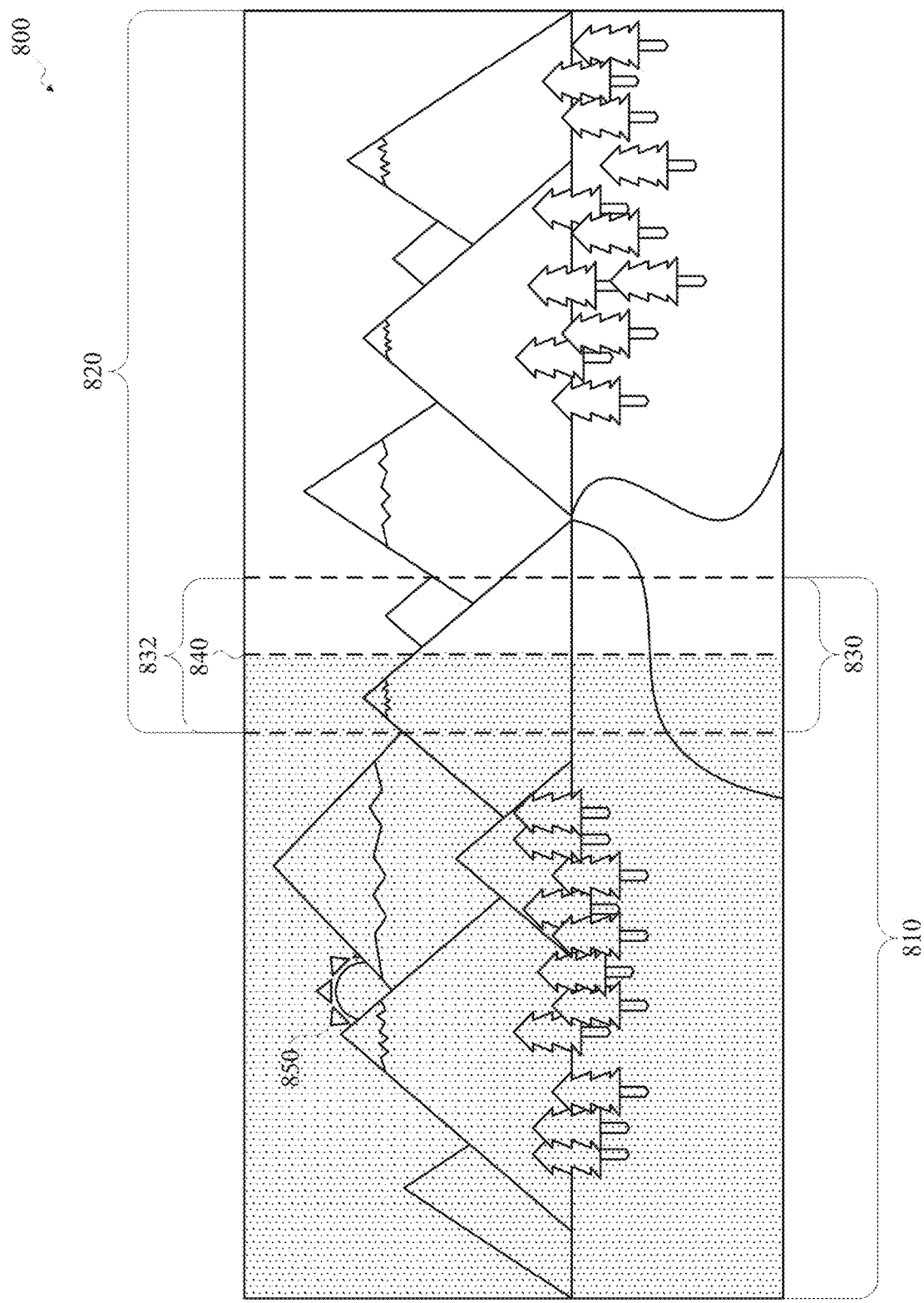
FIG. 8 is a diagram of an example of a combined image including diffuse lens flare in accordance with implementations of this disclosure.

Light received by the image sensor 634 along one or more of the secondary image capture paths 626 may be captured, or otherwise included in a captured image, as diffuse lens flare. As used herein, the term "diffuse lens flare" may refer to a spatially indistinct color, or luminance, distortion, such as distortion in contrast or color saturation, which may be distributed throughout the captured image, or a significant portion, such as greater than half, thereof. Diffuse lens flare may be visually indistinguishable from other visible elements captured in an image. The intensity, brightness, or amount of distortion associated with diffuse lens flare may vary within an image, such as based on the relative orientation of the image capture apparatus 610 to the primary light source 620. An example of an image including diffuse lens flare is shown in FIG. 8.

The second image capture device 640 may concurrently, or substantially concurrently, capture an image, or frame, temporally corresponding to, and spatially partially overlapping, the image captured by the first image capture device 630. The image captured by the second image capture device 640 may omit the lens flare.

Figure 7:
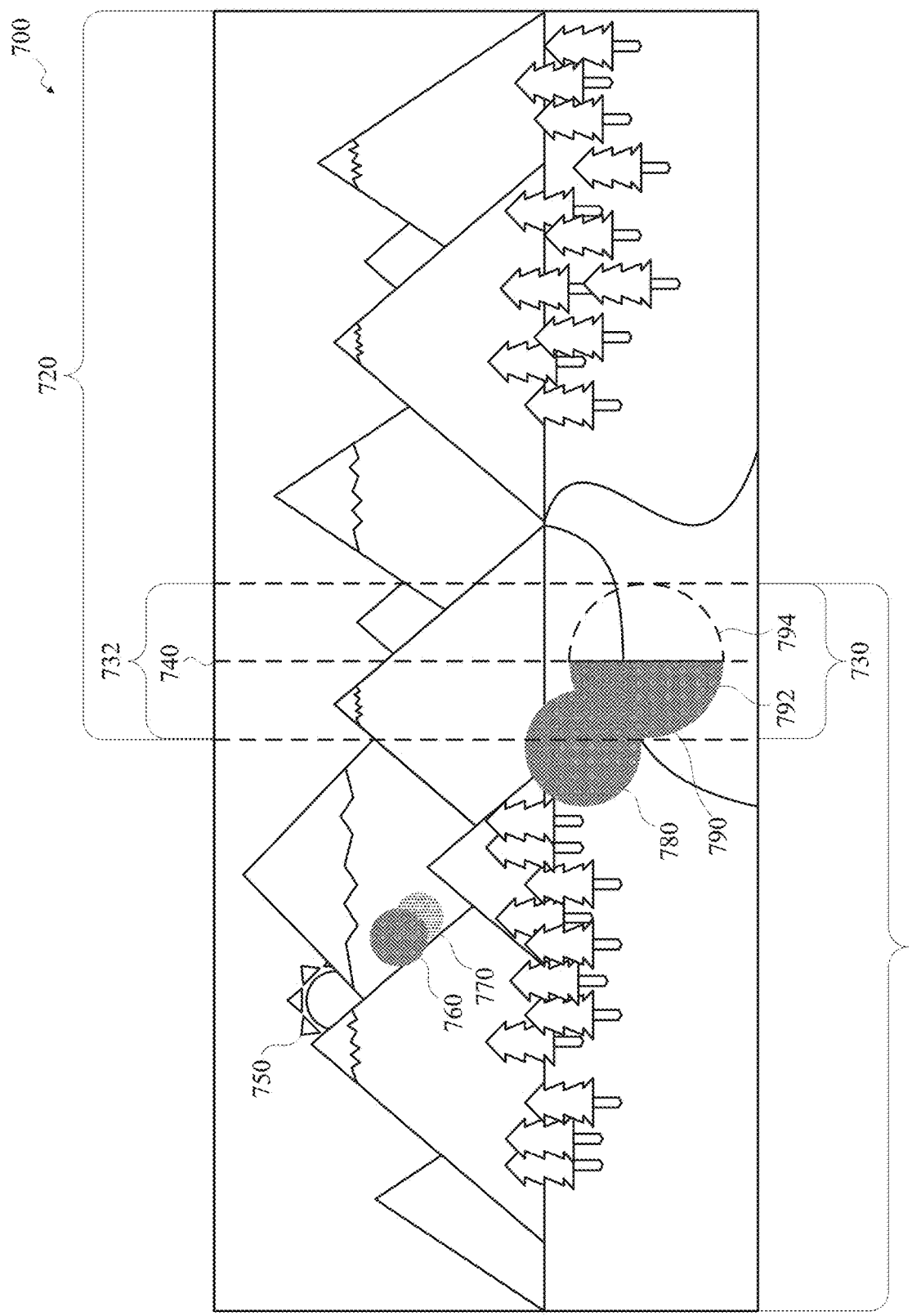
FIG. 7 is a diagram of an example of a combined image including lens flare artifacts in accordance with implementations of this disclosure.

FIG. 7 is a diagram of an example of a combined image 700 including lens flare artifacts in accordance with implementations of this disclosure. The combined image 700 may be an image obtained by combining, merging, or stitching together temporally concurrent, or substantially temporally concurrent, spatially overlapping images captured by respective image capture devices of an image capture apparatus, such as two or more of the image capture devices 130, 132, 134 of the image capture apparatus 110 shown in FIG. 1, two of the image capture device 200 shown in FIG. 2, the image capture devices 320, 322 of the image capture apparatus 300 shown in FIG. 3, or the image capture devices 630, 640 of the image capture apparatus 610 shown in FIG. 6.

For example, a first image capture device may capture the left image 710, and a second image capture device may capture the right image 720. The first image capture device and the second image capture device may have overlapping fields-of-view; the first image 710 may include an overlapping portion 730; and the second image 720 may include a spatially corresponding overlapping portion 732. A combined image 700 may be obtained by combining, merging, or stitching the first image 710 together with the second image 720 along a stitching boundary 740.

The first image 710 may include a primary light source 750, such as the sun, and may include lens flare artifacts 760, 770, 780, 790 corresponding to the primary light source 750. The second image 720 may omit the primary light source 750 and may omit the lens flare artifacts 760, 770, 780, 790. The lens flare artifact 790 may intersect with the stitching boundary 740; a portion 792 of the lens flare artifact 790 along the stitching boundary 740 may be included in the combined image 700, as indicated by the stippled background at 792; and a portion 794 of the lens flare artifact 790 along the stitching boundary 740 may be omitted from the combined image 700, as indicated by the broken line border at 794.

For simplicity and clarity, the input images 710, 720 shown in FIG. 7 are referred to as the left image 710 and the right image 720, respectively, and the combined image is shown as being combined along a vertical stitching boundary 740; however, the relative orientation of the respective images and the path of the stitching boundary may differ. For example, the stitching boundary may have a sinusoidal path.

FIG. 8 is a diagram of an example of a combined image 800 including diffuse lens flare in accordance with implementations of this disclosure. The combined image 800 may be an image obtained by combining, merging, or stitching together, temporally concurrent, or substantially concurrent, spatially overlapping images captured by respective image capture devices of an image capture apparatus, such as two or more of the image capture devices 130, 132, 134 of the image capture apparatus 110 shown in FIG. 1, two of the image capture device 200 shown in FIG. 2, the image capture devices 320, 322 of the image capture apparatus 300 shown in FIG. 3, or the image capture devices 630, 640 of the image capture apparatus 610 shown in FIG. 6.

For example, a first image capture device may capture the left image 810, and a second image capture device may capture the right image 820. The first image capture device and the second image capture device may have overlapping fields-of-view; the first image 810 may include an overlapping portion 830; and the second image 820 may include a spatially corresponding overlapping portion 832. A combined image 800 may be obtained by combining, merging, or stitching the first image 810 together with the second image 820 along a stitching boundary 840.

The first image 810 may include a primary light source 850, such as the sun, and may include diffuse lens flare corresponding to the primary light source 850, as indicated by the stippled background. The stippled background is shown for clarity in FIG. 8. The diffuse lens flare may distort the color of the first image 810 and the corresponding portion of the combined image 800, such as by decreasing contrast or color saturation, which may cause the first image 810 and the corresponding portion of the combined image 800 to appear lighter, brighter, pale, hazy, foggy, less detailed, or a combination thereof.

The second image 820 may omit the primary light source 850 and may omit the diffuse lens flare, as indicated by the white background. For example, the second image 820, and the portion of the combined image 800 corresponding to the second image 820, may be darker than the first image 810 and the portion of the combined image 800 corresponding to the first image 810.

In some embodiments, an image may include lens flare artifacts, such as the lens flare artifacts 760, 770, 780, 790 shown in FIG. 7, and diffuse lens flare, such as the diffuse lens flare shown in FIG. 8.

For simplicity and clarity, the input images 810, 820 shown in FIG. 8 are referred to as the left image 810 and the right image 820, respectively, and the combined image is shown as being combined along a vertical stitching boundary 840; however, the relative orientation of the respective images and the path of the stitching boundary may differ. For example, the stitching boundary may have a sinusoidal path. In another example, the input images may be spherical images, and the overlapping portions may be a respective ring along the outer edge of each of the spherical images.

Figure 9:
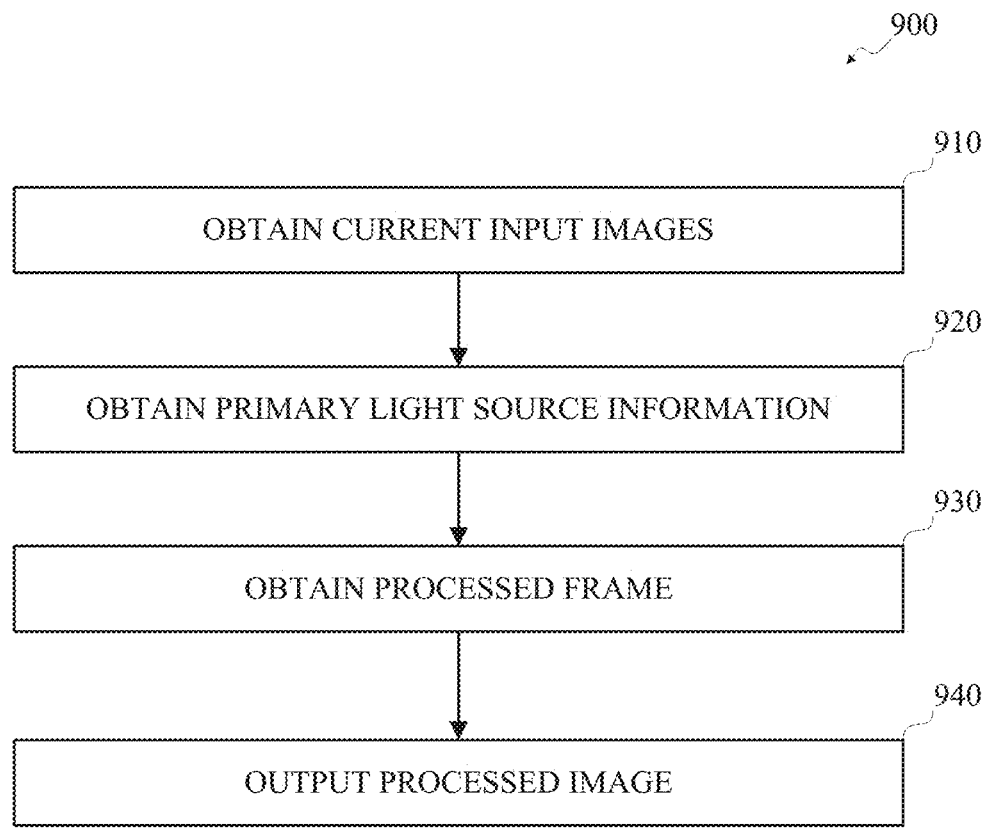
FIG. 9 is a diagram of an example of image signal processing for reducing lens flare in accordance with implementations of this disclosure.

FIG. 9 is a diagram of an example of image signal processing for reducing lens flare 900 in accordance with implementations of this disclosure. Image signal processing for reducing lens flare 900 may be implemented in an image capture apparatus, such as the image capture apparatus 110 shown in FIG. 1 or the image capture apparatus 300 shown in FIG. 3. For example, the image signal processor 500 shown in FIG. 5 may implement image signal processing for reducing lens flare 900.

In some implementations, image signal processing for reducing lens flare 900 may include obtaining input images or input image data at 910; obtaining primary light source information at 920; obtaining a processed image, or frame, at 930; outputting the processed image, or frame, at 940; or a combination thereof.

Input image data may be obtained at 910. An image signal processor, such as the image signal processor 410 shown in FIG. 4 or the image signal processor 500 shown in FIG. 5, which may be included in an image capture apparatus, may receive one or more input image signals, such as the input image signal 430 shown in FIG. 4, from one or more image sensors, such as the image sensor 230 shown in FIG. 2 or the image sensors 340, 342 shown in FIG. 3, or from one or more front image signal processors, such as the front image signal processors 510 shown in FIG. 5, which may include the input image data for an input image.

For example, an image capture apparatus, such as the image capture apparatus 610 shown in FIG. 6, may include two or more image capture devices, such as the image capture devices 630, 640 shown in FIG. 6, which may have overlapping fields-of-view, and the image capture apparatus may obtain a first image signal from the first image capture device and a second image signal from the second image capture device. The first image signal may correspond to a first input image representing a first field-of-view, which may include a primary light source, such as the sun. The second image signal may correspond to a second input image representing a second field-of-view, which may overlap with the first field-of-view, and which may omit the primary light source. The first input image may be temporally concurrent with the second input image. The first input image may include lens flare, and the second input image may omit the lens flare.

Primary light source information corresponding to the primary light source may be obtained at 920. The primary light source information may be obtained based on the first input image, the second input image, or a combination thereof.

Obtaining the primary light source orientation information at 920 may include obtaining the primary light source orientation information based on image data, non-image data, or both. Image data may include color or pixel values, or data derived therefrom, from the input images. Non-image data may include data captured, recorded, or generated in association with the input images, such as temporal data, geospatial data, accelerometer data, magnetometer data, or any other data, or combination of data, distinct from image data that may be used for identifying or determining the primary light source orientation information.

The primary light source brightness information may indicate a brightness, or luminance, of the primary light source. For example, the primary light source may be brighter, such as ten-thousand times brighter, than other content captured in the respective images. The primary light source brightness information may be expressed in a color format, such as a color format including a red component (R), a green component (G), and a blue component (B). Other formats may be used.

Obtaining the primary light source information at 920 based on image data may include obtaining one or more differences between the overlapping portion of the first input image and the second input image. For example, obtaining the primary light source information at 920 may include obtaining an expected, or predicted, alignment of the overlapping portion of the first input image with the spatially corresponding portion of the overlapping portion of the second input image, and obtaining differences between the aligned overlapping portion of the first input image and the aligned overlapping portion of the second input image. The expected, or predicted, alignment may be obtained based on a defined alignment, such as an alignment obtained for a previously generated combined image, and the expected, or predicted, alignment may be obtained independently of, such as prior to, obtaining an alignment for generating a current combined image.

In some embodiments, the difference between the overlapping portion of the first input image and the overlapping portion of the second input image may be obtained based on a subset of the pixels from the respective overlapping portions, such as half of the pixels from the overlapping portion of the first input image and half of the pixels from the overlapping portion of the second input image. Other amounts of pixel data, such as a defined cardinality of pixels, such as 1000 pixels, or a comparison of pixel level information such as luminance, may be used. Intensity differences may be measured along the stitch line, border of the images, or both, and diffused towards the center without a priori knowledge about the one or more sources that may be generating the flare difference.

In some embodiments, obtaining the primary light source orientation information at 920 may omit obtaining the primary light source orientation information based on image data, and may include obtaining the primary light source orientation information based on non-image data. Obtaining the primary light source orientation information at 920 based on non-image data may include obtaining non-image data, such as gyroscopic data, accelerometer data, magnetometer data, global positioning system data, temporal data, any other non-image data, or a combination thereof. For example, the non-image data may include geospatial information, which may indicate a geospatial orientation, or geospatial location, of the primary light source relative to the image capture apparatus or one or more of the image capture devices, and obtaining the primary light source orientation information based on non-image data may include correlating the geospatial orientation information to spatial orientation information within one or more of the input images. Obtaining the primary light source orientation information at 920 based on non-image data may be independent of evaluating or otherwise processing the image data.

In some embodiments, such as embodiments including obtaining the primary light source orientation information at 920 based on non-image data, the accuracy of obtaining the primary light source brightness information based on image data may exceed the accuracy of obtaining both the primary light source orientation information and the primary light source brightness information based on image data.

A processed image, or frame, may be obtained at 930. Obtaining the processed image, or frame, may include obtaining a flare reduced input image having minimized, reduced, or eliminated lens flare. For example, a flare model, such as the flare model used for obtaining the primary light source information obtained at 920, may be projected or applied to the input image that includes the lens flare based on the primary light source information obtained at 920 to minimize, reduce, or eliminate the lens flare. Applying the flare model to minimize, reduce, or eliminate the lens flare at 930 based on the primary light source information obtained at 920 may be the reverse of projecting the differences between the overlapping portions onto the flare model to obtain the primary light source information at 920.

In some embodiments, obtaining the processed image at 930 may include eliminating, or reducing, diffuse lens flare, such as the diffuse lens flare shown in FIG. 8. In some embodiments, obtaining the processed image at 930 may include eliminating, or reducing, lens flare artifacts, such as the lens flare artifacts 760, 770, 780, 790 shown in FIG. 7. In some embodiments, obtaining the processed image at 930 may include eliminating, or reducing, both diffuse lens flare, such as the diffuse lens flare shown in FIG. 8, and lens flare artifacts, such as the lens flare artifacts 760, 770, 780, 790 shown in FIG. 7.

Obtaining the processed image at 930 may include further processing, such as combining the flare reduced input image with one or more corresponding input images to obtain a combined image, or frame, which may be output, such as stored or transmitted, at 940. In some embodiments, the flare reduced input image may be output at 940.

Obtaining a combined image based on the flare reduced input image may improve the accuracy, the efficiency, or both, of obtaining the combined image relative to obtaining the combined image based on the input image including lens flare.

For example, obtaining the combined image may include aligning the input images. The color values of portions, such as pixels, from the input image including lens flare may differ from the color values of spatially corresponding portions, such as spatially corresponding pixels, from the partially overlapping input image. The differences in pixel values may prevent, or significantly reduce the accuracy of, image alignment. Image alignment may be performed based on color gradients, rather than pixel values; however, image alignment based on color gradients may be less efficient, less accurate, or both, relative to image alignment based on pixel values.

The differences between the color values of portions, such as pixels, from the flare reduced input image and the color values of spatially corresponding portions, such as spatially corresponding pixels, from the partially overlapping input image may be minimized, reduced, or eliminated relative to the differences between the color values of portions, such as pixels, from the input image including lens flare and the color values of spatially corresponding portions, such as spatially corresponding pixels, from the partially overlapping input image. Image alignment may be performed based on pixel values, or other discrete image portion color values, from the flare reduced input image and the partially overlapping input image, which may be more efficient, more accurate, or both, relative to image alignment based on color gradients.

A flare compensation algorithm may be implemented in a dual-lens configuration, such as the dual-lens image capture apparatus 300 of FIG. 3. In this example, the algorithm may obtain three inputs. For example, a first input may include an image pair (front and back) that supports still frames extracted from a video stream. For example, the still frames may include JPG and DXR raw image format frames. A second input may include a geometrical calibration for each image capture device and the lever arm between the image capture devices. The geometrical calibration information may be stored as metadata, for example, as general purpose metadata framework (GPMF) tags in the image. A third input may include the shooting parameters of each image. For example, the shooting parameters may include the gain, the integration time, or both, for each image.

Figure 10:
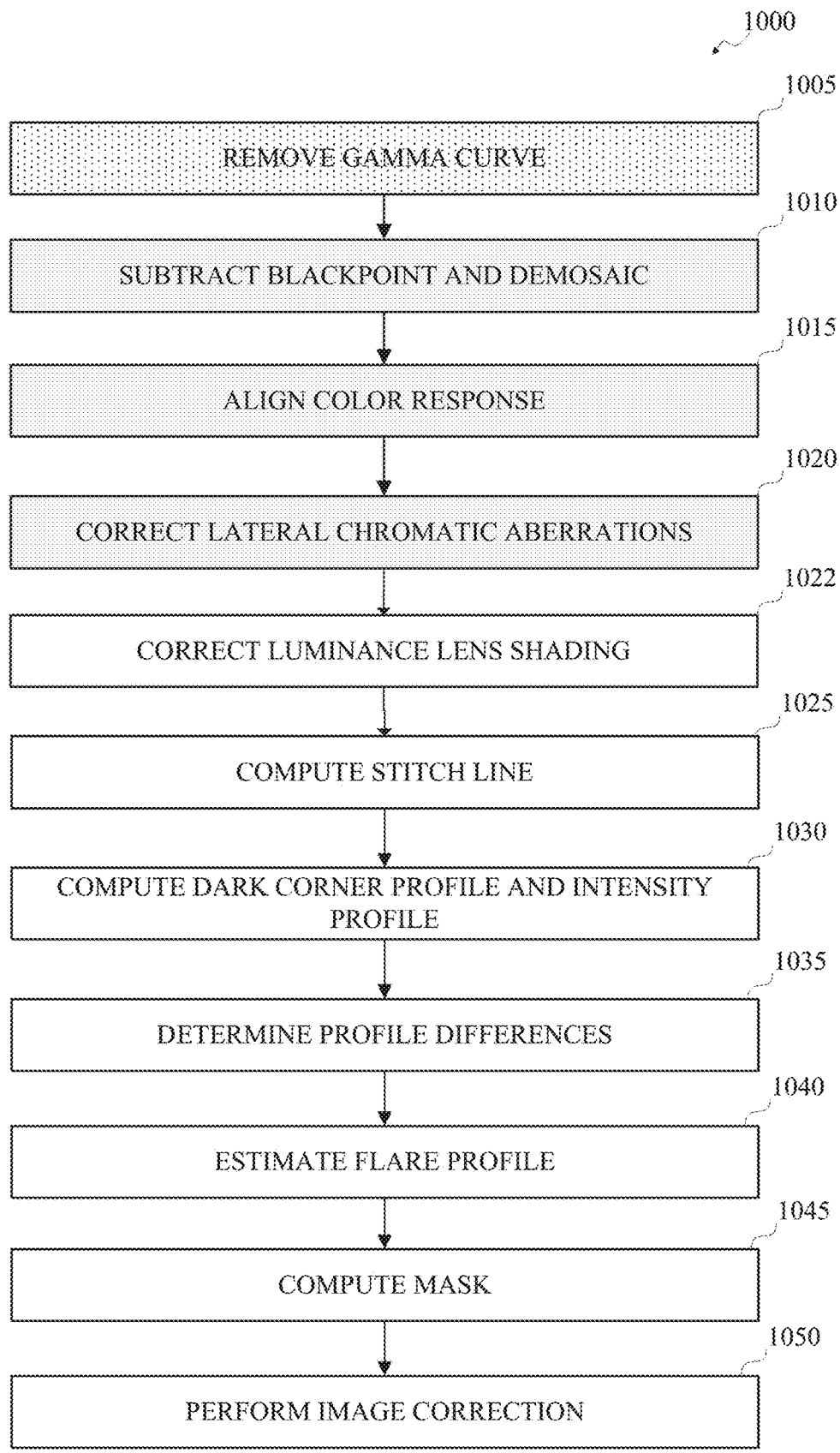
FIG. 10 is a diagram of an example of image signal processing for reducing lens flare in accordance with implementations of this disclosure.

FIG. 10 is a diagram of an example of image signal processing for reducing lens flare 1000 in accordance with implementations of this disclosure. Image signal processing for reducing lens flare 1000 may be implemented in an image capture apparatus, such as the image capture apparatus 110 shown in FIG. 1 or the image capture apparatus 300 shown in FIG. 3. For example, the image signal processor 500 shown in FIG. 5 may implement image signal processing for reducing lens flare 1000.

Referring to FIG. 10, in order to be able to quantify flare, the images are transformed into the linear domain to remove the gamma curve 1005 for images in a JPG format. Block 1005 is shown in stippling to indicate that this step may only be performed for images in JPG format. Accordingly, block 1005 may not be performed for images in a RAW format. The images may be transformed using Equation (1) below.

$$I_{linear} = TC_{sRGB}^{-1}(TC_{flat}^{-1}(I_{in})) \quad \text{Equation (1)}$$

At block 1010, the black point may be subtracted from the input raw data prior to demosaicing. In this example, the color filter array may be of a type Bayer 3. At block 1015, the color response from each image capture device is aligned onto the D50 illuminant. The calibration process measures the D50 scales for the red and blue channels relative to the average green channel. Both image capture devices are then aligned on the same D50 reference using Equation (2) below.

$$\begin{bmatrix} I_r^* \\ I_g^* \\ I_b^* \end{bmatrix} = \begin{bmatrix} k_r & 0 & 0 \\ 0 & 1.0 & 0 \\ 0 & 0 & k_b \end{bmatrix} \begin{bmatrix} I_r \\ I_g \\ I_b \end{bmatrix} \quad \text{Equation (2)}$$

where $$\begin{cases} k_r = \dfrac{\text{Green}_{d50}}{\text{Red}_{d50}} \\ k_b = \dfrac{\text{Green}_{d50}}{\text{Blue}_{d50}} \end{cases}$$

At block 1020, the lateral chromatic aberrations are corrected. At block 1022, the luminance lens shading is corrected. A stitch line is then computed at block 1025. At block 1030, the image capture device computes a dark corner profile and an intensity profile. The differences in the profiles are then determined at block 1035. At block 1040, a flare profile is estimated, and a mask is computed at block 1045. At block 1050, image correction is performed. Blocks 1010, 1015, and 1020 are shaded to indicate that these steps may only be performed on RAW images. Accordingly, blocks 1010, 1015, and 1020 may not be performed on JPG images.

Figure 11:
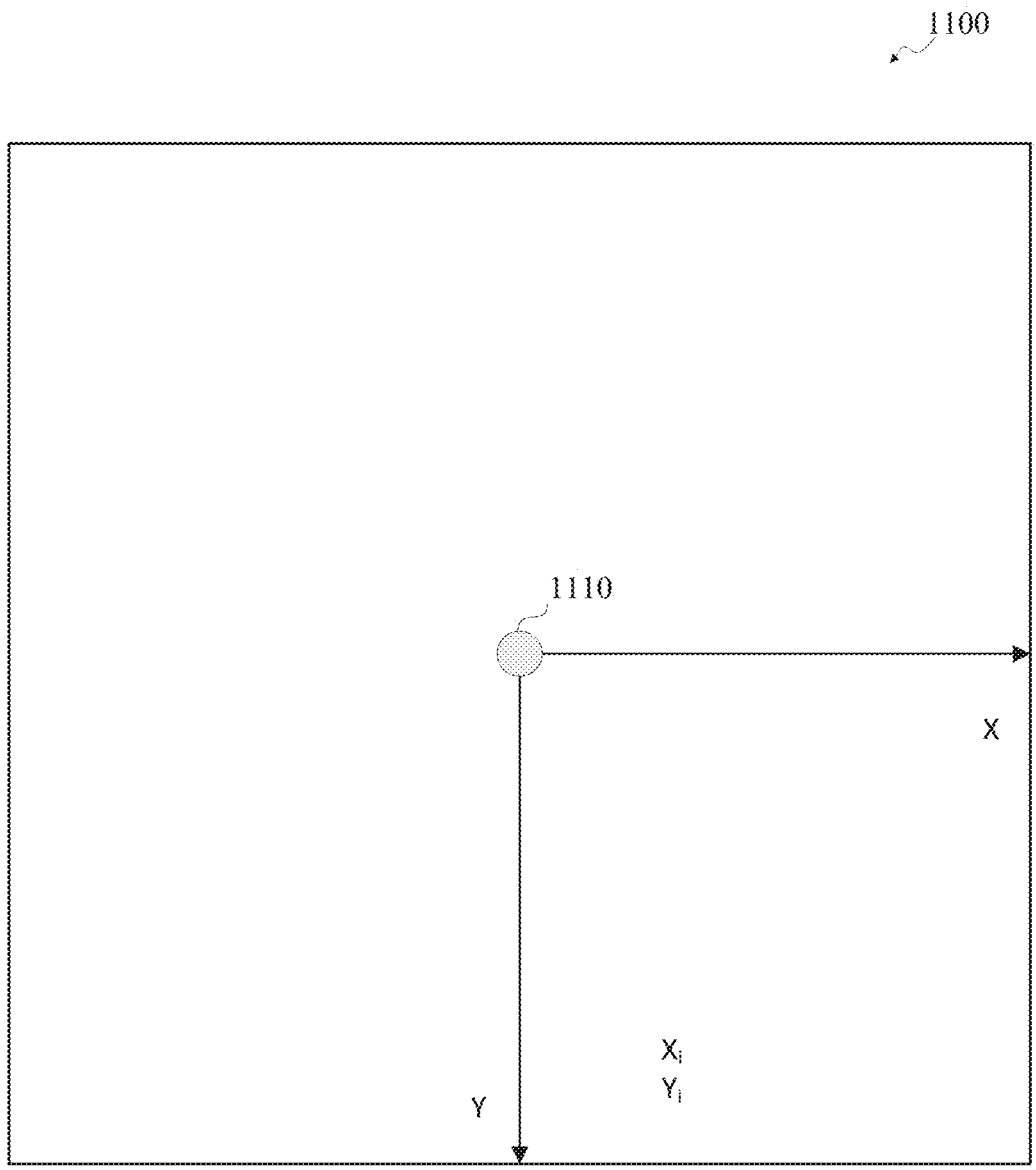
FIG. 11 is a diagram of an example of a square photo centered frame.

FIG. 11 is a diagram of an example of a square photo centered frame 1100. Referring to FIG. 11, the center of the square photo includes a principal point 1110 shown as a vertex of an X and Y axis.

Referring to block 1020 of FIG. 10, a square photo centered frame such as the example shown in FIG. 11 may be used for lateral chromatic aberration correction. The lateral chromatic aberrations may be corrected using the theoretical model created by numerical simulation on a Z600 lens design. In this example, for each pixel, the algorithm computes the relative displacement to the green channel per Equation (3) below.

$$x_{corrected} = k_{channel} * f(x_{raw}, \text{channel}) \quad \text{Equation (3)}$$

where $$x_i = \begin{bmatrix} x_i \\ y_i \end{bmatrix}$$

The luminance lens shading correction may apply a gain depending on the distance to the principal point. The gain may compensate for the lens falloff per Equation (4) below.

$$I_{corrected} = k_x * I_{in} \quad \text{Equation (4)}$$

where $$x = \begin{bmatrix} x \\ y \end{bmatrix}$$

Similar to the lateral chromatic aberration correction, a square photo centered frame may be used for luminance lens shading correction. In this example, the gain may be computed using a polynomial of degree 6.

Referring again to FIG. 10, a stitch line is computed at block 1025. In this example, intensities are measured on the same object in order to compare intensities. The stitch line computation uses a disparity estimation algorithm to ensure alignment of imagery onto the same scene content. Original images are passed to the stitcher and will return the stitch line position in the square format image. The stitching algorithm may deliver a vector corresponding to a 1 disparity shift. The latter may be used when computing the profiles. The stitch line ($S_{back}$ and $S_{front}$) and epipolar line ($E_{back}$ and $E_{front}$) may be computed according to Equation (5) and Equation (6) below.

$$S_{back} = \begin{bmatrix} x_0 & y_0 \\ x_1 & y_1 \\ \dots & \dots \\ x_n & y_n \end{bmatrix} S_{front} = \begin{bmatrix} x_0 & y_0 \\ x_1 & y_1 \\ \dots & \dots \\ x_n & y_n \end{bmatrix} \quad \text{Equation (5)}$$

$$E_{back} = \begin{bmatrix} dx_0 & dy_0 \\ dx_1 & dy_1 \\ \dots & \dots \\ dx_n & dy_n \end{bmatrix} E_{front} = \begin{bmatrix} dx_0 & dy_0 \\ dx_1 & dy_1 \\ \dots & \dots \\ dx_n & dy_n \end{bmatrix} \quad \text{Equation (6)}$$

Figure 12:
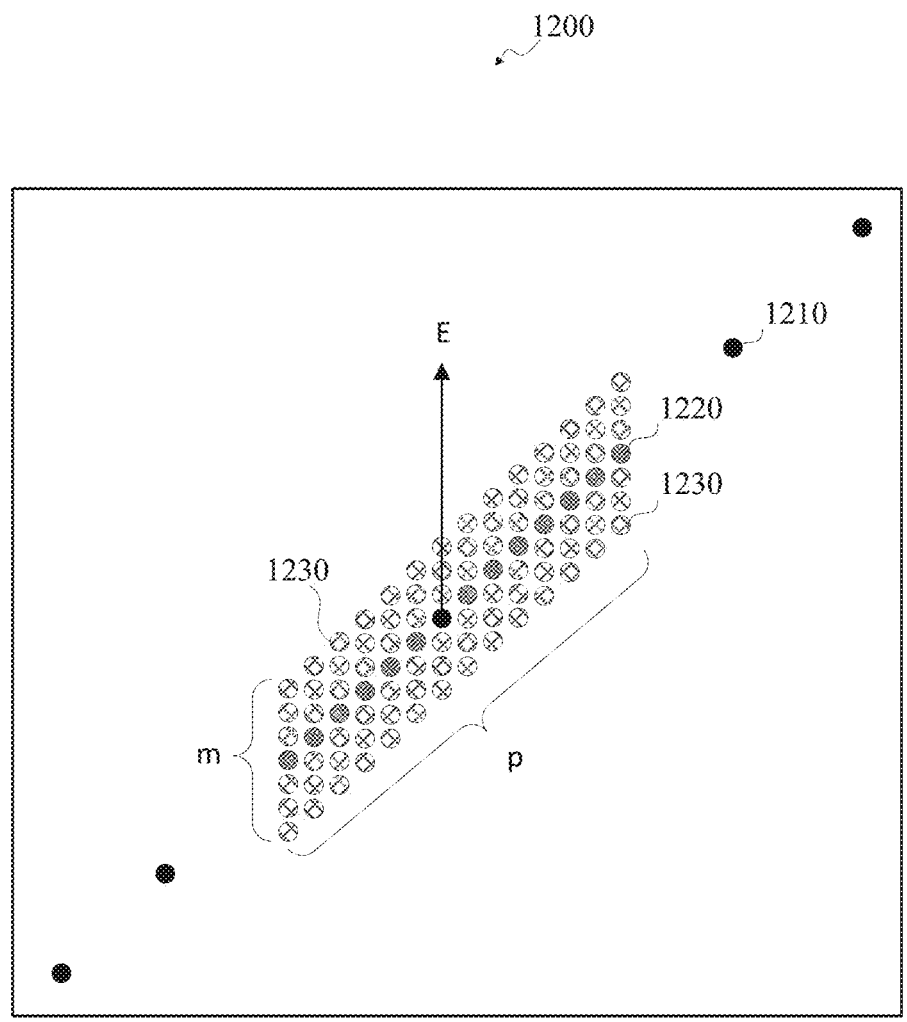
FIG. 12 is a diagram of an example of a sampling pattern used around a vertex of the stitch line.

FIG. 12 is a diagram of an example of a sampling pattern 1200 used around a vertex of the stitch line. In this example, sample points of a stitch line vertex are represented by solid circles 1210. The sample points along a stitch line subsample are represented by stippled circles 1220. The sample points along an epipolar direction (E) subsample are represented by cross-hatched circles 1230. In this example, the maximum distance along the epipolar direction may be tuned and is shown as m in FIG. 12. In this example, p describes the amount of samples used along the stitch line to compute the statistical value.

Referring again to FIG. 10, at block 1030, the image capture device computes a dark corner profile and an intensity profile. In some instances, intensity differences may exist when comparing profiles along the stitch line. Some reasons for these intensity differences may include an object that is outside of a disparity range (i.e., the object is too close to the sensor), the presence of occlusions, or inaccuracies of the stitcher due to inaccurate calibration or drifts in content with poor textures. A dark corner profile may be derived by considering portions of the sensor that are visible in the image but outside the image circle. The relative illumination in the dark corner areas outside the image circle may include information about the source intensity and the quantity of flare. Considering the relative illumination in the dark corner areas outside the image circle may aid in rejecting false positives.

From the pair of square images, an average intensity profile along a circle outside of the image circle may be extracted. The average intensity profile along the circle outside of the image circle may be referred to as a dark profile. The dark profile may be an average of intensities measured along circles with increasing radius. The dark profile may be derived using Equation (7) and Equation (8) below.

$$\theta \in [0, 2\pi] \begin{cases} x_i = \dfrac{\text{width}}{2} - \text{radius} * \sin(\theta) - \dfrac{u_0}{2} \\ y_i = \dfrac{\text{height}}{2} - \text{radius} * \cos(\theta) - \dfrac{v_0}{2} \end{cases} \quad \text{Equation (7)}$$

$$C(\text{channel}, \theta_j) = \dfrac{1}{n-s} \sum_{i=s}^{n} C_i(\text{channel}, \theta_j) \quad \text{Equation (8)}$$

For each vertex of the stitch line, a local average of the intensity may be measured. For example, the sampling pattern used may ensure that measurements are performed on the same scene elements in the front and in the back image. When building an intensity profile for each image, the maximum distance along the epipolar direction may be tuned, as shown in FIG. 12. The maximum distance, m, along the epipolar direction may be a value that includes one or more compromises. One compromise may include reducing sensitivity to pixel level discrepancies, such as noise, remaining color aberrations, calibration accuracy, or a combination thereof. Another compromise may include the risk of measuring on different objects. For example, the risk may increase with the distance from the stitch line. Yet another compromise may include the risk of having a saturated sample in one of the images. In this example, to ensure an aggregation of statistics performed on a same region in both images, the statistic is rejected when it is determined that one of the samples is saturated. An intensity profile on each image may be determined using Equation (9), Equation (10), and Equation (11) below.

$$x_{i,d\theta} = f\left(\text{channel}, S_{side}(\theta_j + d\theta) + i * \dfrac{E_{side}(\theta_j)}{\|E_{side}(\theta_j)\|}\right) \quad \text{Equation (9)}$$

$$I_{side}(\text{channel}, \theta_j) = \frac{a}{pm} \sum_{d\theta=-p}^{p/2} \sum_{2i=-m/2}^{m/2} x_{i,d\theta} \qquad \text{Equation (10)}$$

$$a = \prod_{d\theta=-p}^{p/2} \prod_{2i=-m/2}^{m/2} issat(x_{i,d\theta}) \qquad \text{Equation (11)}$$

An entire statistic may be rejected (i.e., zeroed out) based on a determination that one sample is saturated per Equation (12) below.

$$issat(x) = \begin{cases} 0 & \text{if } x > \text{saturation} \\ 1 & \text{otherwise} \end{cases} \qquad \text{Equation (12)}$$

Referring again to FIG. 10, at block 1035 the profile differences are determined. Profile subtraction between the front image and the back image may occur in multiple operations. For example, a first operation may include aligning intensity by compensating exposures between the front image and the back image. A second operation may include setting the saturated values to "no information" (nan) and then computing the difference between the profiles. The difference between the profiles may be determined according to Equation (13) below.

$$\Delta I(\text{channel}, \theta) = \qquad \text{Equation (13)}$$
$$sat2nan\left(I_{back}(\text{channel}, \theta) * \frac{EV_{target}}{EV_{back}}, I_{back}(\text{channel}, \theta)\right) -$$
$$sat2nan\left(I_{front}(\text{channel}, \theta) * \frac{EV_{target}}{EV_{front}}, I_{front}(\text{channel}, \theta)\right)$$

Similarly, the differences in corner estimates may be determined according to Equation (14) below.

$$\Delta C(\text{channel}, \theta) = \qquad \text{Equation (14)}$$
$$sat2nan\left(C_{back}(\text{channel}, \theta) * \frac{EV_{target}}{EV_{back}}, C_{back}(\text{channel}, \theta)\right) -$$
$$sat2nan$$
$$\left(C_{front}(\text{channel}, \theta) * \frac{EV_{target}}{EV_{front}}, C_{front}(\text{channel}, \theta)\right)$$

where $$EV_{target} = \max(EV_{back}, EV_{front})$$

and $$sat2nan(\text{value}) =$$
$$\{nan \text{ if value} \geq \text{saturation limit value}$$

Referring to block 1040 of FIG. 10, the flare profile may be estimated along the border of the image circle. In order to determine the flare profile along the border of the image circle, two sources of information may be combined. A first source of information may include the difference of intensities along the stitch line between the front image capture device and the back image capture device. The stitch line may pass on the same objects in the two images, and the intensity differences may be explained by the flare. A second source of information may include the difference along concentric circles measured outside of the image circle. This area may be referred to as a dark corner area. The assumption is that the difference from pure black is due to parasite reflections in the barrel and at each interface in the optical system. The observations may be performed on each channel independently.

Figure 13:
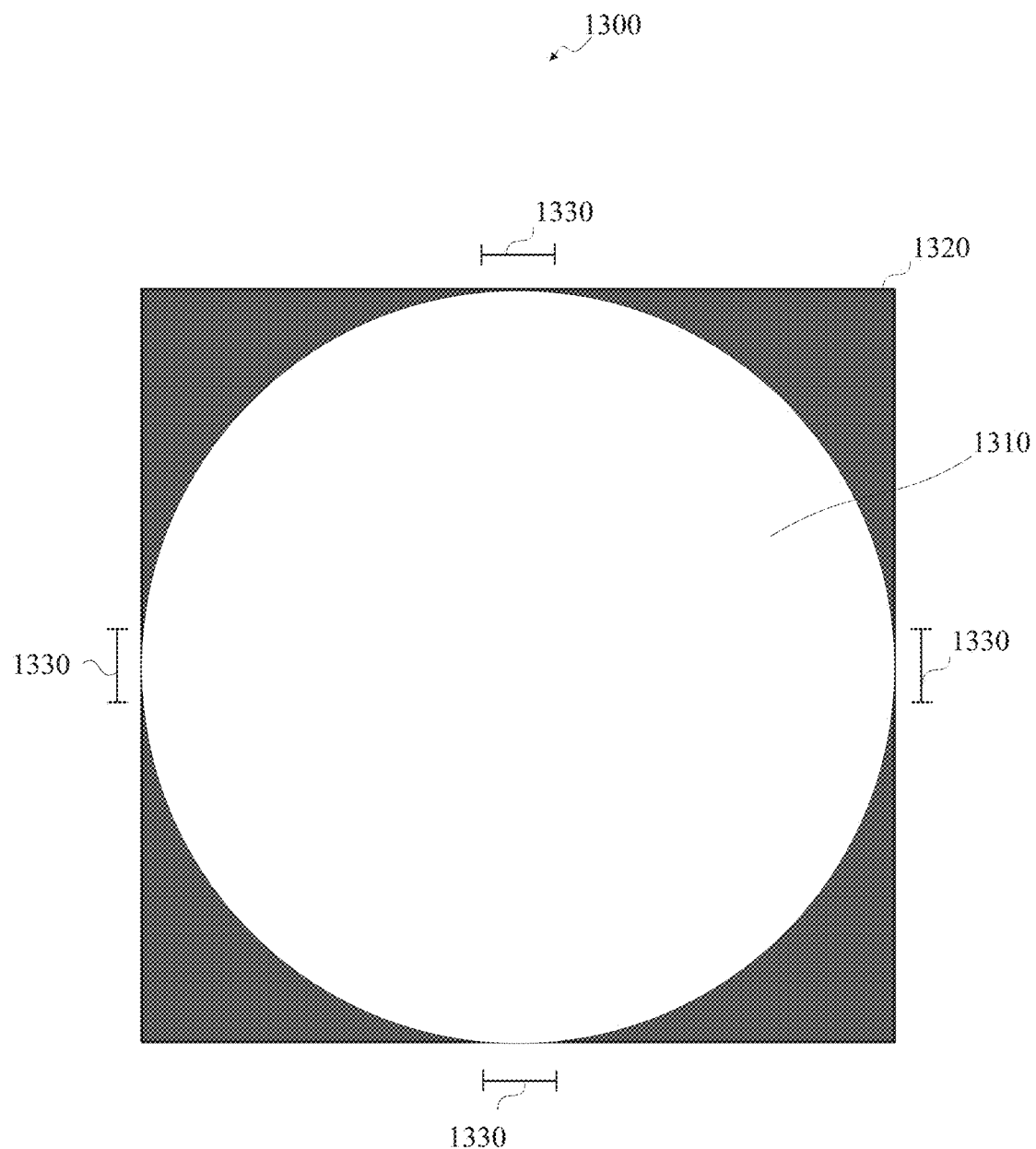
FIG. 13 is a diagram of an example of an image that includes an image circle portion and dark corner areas.

FIG. 13 is a diagram of an example of an image 1300 captured by an image capture apparatus, such as the image capture apparatus 110 shown in FIG. 1 or the image capture apparatus 300 shown in FIG. 3. As shown in FIG. 13, the image 1300 includes an image circle portion 1310 and dark corner areas 1320. The dark corner areas 1320 are areas along concentric circles measured outside the image circle portion 1310. The dark corner areas 1320 are not available along the entire image border, resulting in gaps 1330 in areas along the image border. The gaps 1330 may be areas where the image border is tangent to the image circle portion 1310.

In order to compensate for the gaps 1330, the dark corner areas 1320 are transformed into a profile along the entire image circle. The transformation from a raw dark corner observation to an estimator may include filling the gaps, regularizing, or both. Filling the gaps may include a linear interpolation between each end. Regularizing may include a convolution with two Gaussian kernels, for example, using Equation (15) below.

$$D_{reg} = k_{narrow}(D_{filled} \otimes \text{gauss}(\sigma_{narrow})) + k_{wide}(D_{filled} \otimes \text{gauss}(\sigma_{wide})) \qquad \text{Equation (15)}$$

The flare profile estimation may include two input types. For example, a first input type may be the intensity difference along the stitch line, and the second input type may be the corner observations and the derived estimator. The intensity difference along the stitch line may carry information about the true flare difference level along the stitch line. The intensity difference along the stitch line may be noisy due to the image zones with a strong intensity gradient. The intensity difference along the stitch line may be biased due to mismatches on the stitch line. The intensity difference along the stitch line may be incomplete due to saturation.

The corner observations may carry information about a belief in flare intensity. In this example, the accuracy of the flare difference level may decrease with intensity. The estimate is derived from partial information and may be biased by specular reflections in the barrel of the image capture device.

In order to derive an accurate flare difference estimate, two types of observations may be used. For example, a flare estimation filter may employ a strategy that includes using the corner estimator in the areas where the accuracy is the highest. For example, the flare estimation filter may use the zones where there is a strong belief that there is no flare. The flare estimation filter may employ a strategy that includes quantifying the actual flare level on the intensity differences along the stitch line. The flare estimation filter may be run in a forward direction and a backward direction.

The estimation process may be an iterative two-operation procedure. In a first operation, a flare level at sample $\theta_{i+1}$ may be predicted to assess whether observations at $\theta_{i+1}$ are usable, for example, not saturated. In a second operation, the flare level at sample $\theta_{i+1}$ is updated. The procedure to predict the flare level may be performed using Equation (16) to Equation (18) below.

$$\hat{x}_{i'} = (1-k_i)\hat{x}_{i-1} + k_i s_{i-1} d_i \qquad \text{Equation (16)}$$

-continued $$\hat{P}_{i'} = (1-k_i)^2 \hat{P}_{i-1} + k_i^2 s_{i-1}^2 B_i + u \quad \text{Equation (17)}$$

$$B_i = \frac{1}{w} \sum_{k=-w/2}^{w/2} d_{i+k}^2 - \left(\frac{1}{w}\sum_{k=-w/2}^{w/2} d_{i+k}\right)^2 + d_i^2 \quad \text{Equation (18)}$$

The procedure to update the flare level may be performed using Equation (19) to Equation (24) below.

$$z_i \neq nan \quad \text{Equation (19)}$$

$$K = \frac{\hat{P}_{i'}}{\hat{P}_{i'} + v_i} \quad \text{Equation (20)}$$

$$v_i = \frac{1}{w}\sum_{k=-w/2}^{w/2} I_{i+k}^2 - \left(\frac{1}{w}\sum_{k=-w/2}^{w/2} I_{i+k}\right)^2 + I_i^2 \quad \text{Equation (21)}$$

$$\hat{x}_i = \hat{x}_{i'} + K(m_i + \hat{x}_{i'}) \quad \text{Equation (22)}$$

$$\hat{P}_i = (1-K)\hat{P}_{i'} \quad \text{Equation (23)}$$

$$s_i = \frac{\hat{x}_i}{d_i} \quad \text{Equation (24)}$$

If no observation is available, then Equation (25) to Equation (28) below are used.

$$z_i = nan \quad \text{Equation (25)}$$

$$\hat{x}_i = s_{i-1} d_i \quad \text{Equation (26)}$$

$$\hat{P}_i = s_{i-1}^2 B_i + u \quad \text{Equation (27)}$$

$$s_i = s_{i-1} \quad \text{Equation (28)}$$

Referring to FIG. 10, at block 1045, a mask is computed to create a flare mask profile from the flare difference estimation along the stitch line. This flare mask profile is mapped onto the image circle and then diffused towards the center of the image. The diffusion is performed in a (theta, radius) space. The diffusion is performed by initializing the grid per channel using Equation (29) below.

$$\begin{cases} m_0(\theta, r) = \text{start value} + \text{offset} \\ m_0(\theta, r) = F(\theta) + \text{offset} \end{cases} \quad \text{Equation (29)}$$

where offset $= -\min(F(\theta))$ start value $= \text{average}(F(\theta))$

Upon initialization of the grid per channel, diffusion per channel is performed. The diffusion may be performed by computing the pixel value from a neighbor pixel value for the next iteration using Equation (30) below.

$$m_{n+1}(\theta,r) = 0.25 * m_n(\theta, r+dr) + 0.25 * m_n(\theta, r-dr) + 0.25 * m_n(\theta+d\theta, r) + 0.25 * m_n(\theta-d\theta, r) \quad \text{Equation (30)}$$

Once the diffused grid is computed, a warp function may be performed to return to a square image space (per channel). In this example, the resulting correction mask for each side may be:

$$\text{mask}_{back} = \max(0, \text{warp}_{(r,\theta) \to (x,y)}(m))$$

$$\text{mask}_{front} = -\min(0, \text{warp}_{(r,\theta) \to (x,y)}(m))$$

Referring to FIG. 10, once the masks are computed, image correction may be performed at block 1050. In the examples disclosed herein, the flare being considered is an additive effect, and therefore the correction may be a subtraction of the mask from the original image. Prior to the subtraction of the mask, the mask may be scaled back to the original exposure according to Equation (31) below.

$$\hat{f} = \text{satfromoriginal}\left(f - \text{mask}_{side} * \frac{EV_{side}}{EV_{target}}, f\right) \quad \text{Equation (31)}$$

Once the mask is subtracted, the zones that were saturated in the original image are returned to saturation using Equation (32) below.

$$\text{satfromoriginal}(v, v_{original}) = \quad \text{Equation (32)}$$

$$\begin{cases} \text{saturation limit if } v_{original} \geq \text{saturation limit} \\ v \end{cases}$$

Where certain elements of these implementations may be partially or fully implemented using known components, those portions of such known components that are necessary for an understanding of the present disclosure have been described, and detailed descriptions of other portions of such known components have been omitted so as not to obscure the disclosure.

In the present specification, an implementation showing a singular component should not be considered limiting; rather, the disclosure is intended to encompass other implementations including a plurality of the same component, and vice-versa, unless explicitly stated otherwise herein.

Further, the present disclosure encompasses present and future known equivalents to the components referred to herein by way of illustration.

As used herein, the term "bus" is meant generally to denote any type of interconnection or communication architecture that may be used to communicate data between two or more entities. The bus could be optical, wireless, infrared, or another type of communication medium. The exact topology of the bus could be, for example, standard bus, hierarchical bus, network-on-chip, address-event-representation (AER) connection, or other type of communication topology used for accessing, for example, different memories in a system.

As used herein, the terms "computer," "computing device," and "computerized device" include, but are not limited to, personal computers (PCs) and minicomputers (whether desktop, laptop, or otherwise), mainframe computers, workstations, servers, personal digital assistants (PDAs), handheld computers, embedded computers, programmable logic devices, personal communicators, tablet computers, portable navigation aids, Java 2 Platform, Micro Edition (J2ME) equipped devices, cellular telephones, smartphones, personal integrated communication or entertainment devices, or literally any other device capable of executing a set of instructions.

As used herein, the term "computer program" or "software" is meant to include any sequence of human or machine cognizable operations that perform a function. Such a program may be rendered in virtually any programming language or environment, including, for example, C/C++, C #, Fortran, COBOL, MATLAB™, PASCAL, Python, assembly language, markup languages (e.g., HTML, Standard Generalized Markup Language (SGML), XML, Voice Markup Language (VoxML)), as well as object-oriented environments such as the Common Object Request Broker Architecture (CORBA), Java™ (including J2ME, Java Beans), and/or Binary Runtime Environment, such as Binary Runtime Environment for Wireless (BREW).

As used herein, the terms "connection," "link," "transmission channel," "delay line," and "wireless" mean a causal link between any two or more entities (whether physical or logical/virtual) that enables information exchange between the entities.

As used herein, the terms "integrated circuit," "chip," and "IC" are meant to refer to an electronic circuit manufactured by the patterned diffusion of trace elements into the surface of a thin substrate of semiconductor material. By way of non-limiting example, integrated circuits may include field programmable gate arrays (FPGAs), a programmable logic device (PLD), reconfigurable computer fabrics (RCFs), systems on a chip (SoC), application-specific integrated circuits (ASICs), and/or other types of integrated circuits.

As used herein, the term "memory" includes any type of integrated circuit or other storage device adapted for storing digital data, including, without limitation, read-only memory (ROM), programmable ROM (PROM), electrically erasable PROM (EEPROM), dynamic random access memory (DRAM), Mobile DRAM, synchronous DRAM (SDRAM), Double Data Rate 2 (DDR/2) SDRAM, extended data out (EDO)/fast page mode (FPM), reduced latency DRAM (RLDRAM), static RAM (SRAM), "flash" memory (e.g., NAND/NOR), memristor memory, and pseudo SRAM (PSRAM).

As used herein, the terms "microprocessor" and "digital processor" are meant generally to include digital processing devices. By way of non-limiting example, digital processing devices may include one or more of digital signal processors (DSPs), reduced instruction set computers (RISCs), general-purpose complex instruction set computing (CISC) processors, microprocessors, gate arrays (such as field programmable gate arrays), PLDs, reconfigurable computer fabrics (RCFs), array processors, secure microprocessors, application-specific integrated circuits (ASICs), and/or other digital processing devices. Such digital processors may be contained on a single unitary IC die, or distributed across multiple components.

As used herein, the term "network interface" refers to any signal, data, and/or software interface with a component, network, and/or process. By way of non-limiting example, a network interface may include one or more of FireWire (e.g., FW400, FW110, and/or other variations), USB (e.g., USB2), Ethernet (e.g., 10/100, 10/100/1000 (Gigabit Ethernet), 10-Gig-E, and/or other Ethernet implementations), MoCA, Coaxsys (e.g., TVnet™), radio frequency tuner (e.g., in-band or out-of-band, cable modem, and/or other radio frequency tuner protocol interfaces), Wi-Fi (802.11), WiMAX (802.16), personal area network (PAN) (e.g., 802.15), cellular (e.g., 3G, LTE/LTE-A/TD-LTE, GSM, and/or other cellular technology), IrDA families, and/or other network interfaces.

As used herein, the term "Wi-Fi" includes one or more of IEEE-Std. 802.11, variants of IEEE-Std. 802.11, standards related to IEEE-Std. 802.11 (e.g., 802.11 a/b/g/n/s/v), and/or other wireless standards.

As used herein, the term "wireless" means any wireless signal, data, communication, and/or other wireless interface. By way of non-limiting example, a wireless interface may include one or more of Wi-Fi, Bluetooth, 3G (3GPP/3GPP2), High Speed Downlink Packet Access/High Speed Uplink Packet Access (HSDPA/HSUPA), Time Division Multiple Access (TDMA), Code Division Multiple Access (CDMA) (e.g., IS-95A, Wideband CDMA (WCDMA), and/or other wireless technology), Frequency Hopping Spread Spectrum (FHSS), Direct Sequence Spread Spectrum (DSSS), Global System for Mobile communications (GSM), PAN/802.15, WiMAX (802.16), 802.20, narrowband/Frequency Division Multiple Access (FDMA), Orthogonal Frequency Division Multiplex (OFDM), Personal Communication Service (PCS)/Digital Cellular System (DCS), LTE/LTE-Advanced (LTE-A)/Time Division LTE (TD-LTE), analog cellular, Cellular Digital Packet Data (CDPD), satellite systems, millimeter wave or microwave systems, acoustic, infrared (i.e., IrDA), and/or other wireless interfaces.

As used herein, the term "robot" may be used to describe an autonomous device, autonomous vehicle, computer, artificial intelligence (AI) agent, surveillance system or device, control system or device, and/or other computerized device capable of autonomous operation.

As used herein, the terms "camera," or variations thereof, and "image capture device," or variations thereof, may be used to refer to any imaging device or sensor configured to capture, record, and/or convey still and/or video imagery that may be sensitive to visible parts of the electromagnetic spectrum, invisible parts of the electromagnetic spectrum (e.g., infrared, ultraviolet), and/or other energy (e.g., pressure waves).

While certain aspects of the technology are described in terms of a specific sequence of operations of a method, these descriptions are illustrative of the broader methods of the disclosure and may be modified by the particular application. Certain operations may be rendered unnecessary or optional under certain circumstances. Additionally, certain operations or functionality may be added to the disclosed implementations, or the order of performance of two or more operations may be permuted. All such variations are considered to be encompassed within the scope and spirit of the disclosure.

While the above-detailed description has shown, described, and pointed out novel features of the disclosure as applied to various implementations, it will be understood that various omissions, substitutions, and changes in the form and details of the devices or processes illustrated may be made by those skilled in the art without departing from the scope and spirit of the disclosure. The foregoing description is in no way meant to be limiting, but rather should be taken as illustrative of the general principles of the technology.

What is claimed is:

1. A method for flare compensation, comprising:
obtaining a first input frame and a second input frame, wherein the first input frame includes lens flare, and wherein the first input frame and the second input frame comprise color channels;
obtaining a stitch line between the first input frame and the second input frame;
obtaining, for the first input frame, a first intensity profile;
obtaining, for the second input frame, a second intensity profile;
obtaining an intensity profile as a difference between the first intensity profile and the second intensity profile;
obtaining, for the first input frame, a first dark corner profile based on a first illumination of a first area outside a first image circle of the first input frame;

obtaining, for the second input frame, a second dark corner profile based on a second illumination of a second area outside a second image circle of the second input frame;

obtaining a dark corner profile as a difference between the first dark corner profile and the second dark corner profile;

calculating a flare model using the intensity profile and the dark corner profile;

obtaining a flare mask based on the flare model and on a flare difference estimation along the stitch line between the first input frame and the second input frame; and correcting the first input frame by subtracting the flare mask from the first input frame.

2. The method of claim 1,
wherein obtaining the first dark corner profile comprises:
obtaining, for at least some of the color channels, respective first dark corner profiles based on respective first illuminations of the first area outside the first image circle of the first input frame; and
wherein obtaining the first dark corner profile comprises:
obtaining, for the at least some of the color channels, respective second dark corner profiles based on respective second illuminations of the second area outside the second image circle of the second input frame.

3. The method of claim 2, wherein obtaining, for the at least some of the color channels, the respective first dark corner profiles, comprises:
obtaining, for one color channel of the at least some of the color channels, one of the respective first dark corner profiles by averaging respective intensities of the one color channel along concentric circles of increasing radii.

4. The method of claim 1,
wherein obtaining, for the first input frame, the first intensity profile comprises:
for at least some first vertices of the stitch line in the first input frame, obtaining respective first local average intensities; and
wherein obtaining, for the second input frame, the second intensity profile comprising:
for at least some second vertices of the stitch line in the second input frame and corresponding to the at least some of the first vertices, obtaining respective second local average intensities.

5. The method of claim 4, wherein the respective first local average intensities and the respective second local average intensities are obtained using a sampling pattern.

6. The method of claim 1,
wherein the first image circle includes first gaps and the second image circle includes second gaps,
wherein the first gaps are located where the first input frame is tangent to the first image circle, and
wherein the second gaps are located where the second input frame is tangent to the second image circle.

7. The method of claim 6, wherein calculating the flare model using the intensity profile and the dark corner profile comprises:
filling the first gaps; and
filling the second gaps.

8. The method of claim 1, wherein obtaining the flare mask based on the flare difference estimation along the stitch line between the first input frame and the second input frame comprises:
mapping the flare model onto at least one of the first image circle or the second image circle; and diffusing the flare mask towards a respective center of at least one of the first input frame or the second input frame.

9. The method of claim 8, wherein diffusing the flare mask towards the respective center of the at least one of the first input frame or the second input frame comprises:
diffusing a color channel flare mask of a color channel towards the respective center of the color channel of the at least one of the first input frame or the second input frame.

10. A non-transitory computer-readable storage medium, comprising executable instructions that, when executed by a processor, facilitate performance of operations comprising operations to:
obtain a first input frame and a second input frame, wherein the first input frame includes lens flare, and wherein the first input frame and the second input frame are in an RGB color space;
calculate a stitch line between the first input frame and the second input frame;
obtain a dark corner profile based on a relative illumination of a first dark area outside a first image circle of the first input frame and a second dark area outside a second image circle of the second input frame that is different from the first input frame;
obtain a flare mask based on the dark corner profile and a flare difference estimation along the stitch line between the first input frame and the second input frame; and
obtain a processed frame by modifying the first input frame based on a flare model to minimize the lens flare.

11. The non-transitory computer-readable storage medium of claim 10, wherein to modify the first input frame comprises to:
apply the flare model to the first input frame; and
subtract the flare mask from the first input frame.

12. The non-transitory computer-readable storage medium of claim 10, wherein to obtain the first input frame and the second input frame comprises to:
obtain the first input frame from a first image capture device, the first image capture device having a first field-of-view; and
obtain the second input frame from a second image capture device, the second image capture device having a second field-of-view partially overlapping the first field-of-view.

13. The non-transitory computer-readable storage medium of claim 10, wherein to calculate the stitch line between the first input frame and the second input frame comprises to:
measure first intensities of an object in the first input frame and second intensities of the object in the second input frame;
obtain a stitch line position of the stitch line; and
obtain a vector corresponding to a one disparity shift, wherein the vector is obtained using first coordinates of the stitch line and a first epipolar line in the first input frame and second coordinates of the stitch line and a second epipolar line in the second input frame.

14. The non-transitory computer-readable storage medium of claim 10, wherein the lens flare corresponds to a primary light source.

15. An apparatus comprising:
a first image capture device;
a second image capture device; and
an image processor, the image processor configured to:

obtain a first input frame captured by the first image capture device, the first image capture device having a first field-of-view, and the first input frame including lens flare;

obtain a second input frame captured by the second image capture device, the second image capture device having a second field-of-view partially overlapping the first field-of-view;

obtain a dark corner profile as a difference between a first dark corner profile and a second dark corner profile, wherein the first dark corner profile is obtained based only on a first illumination of a first area outside a first image circle of the first input frame, and wherein the second dark corner profile is obtained based only on a second illumination of a second area outside a second image circle of the second input frame;

obtain a flare mask based on a flare difference estimation, obtained using the dark corner profile, along a stitch line between the first input frame and the second input frame; and obtain a processed frame by modifying the first input frame based on a flare model to minimize the lens flare.

16. The apparatus of claim 15, wherein to modify the first input frame to minimize the lens flare comprises to:
apply the flare model to the first input frame;
subtract the flare mask from the first input frame to obtain the processed frame; and
output the processed frame.

17. The apparatus of claim 15, wherein to modify the first input frame to minimize the lens flare comprises to:
modify the first input frame to minimize a diffuse lens flare.

18. The apparatus of claim 17, wherein the second input frame omits the diffuse lens flare.

19. The apparatus of claim 15, wherein to modify the first input frame to minimize the lens flare comprises to:
modify the first input frame to minimize a lens flare artifact.

20. The device of claim 15, wherein the lens flare corresponds to a primary light source.

* * * * *